US012802693B2

(12) United States Patent
Takeda et al.

(10) Patent No.: US 12,802,693 B2
(45) Date of Patent: Nov. 17, 2026

(54) DECODING DEVICE, DECODING METHOD, PROGRAM, ENCODING DEVICE, AND ENCODING METHOD

(71) Applicant: SONY GROUP CORPORATION, Tokyo (JP)

(72) Inventors: Hirofumi Takeda, Kanagawa (JP); Shuichiro Nishigori, Tokyo (JP); Shiro Suzuki, Kanagawa (JP); Takahiro Watanabe, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 133 days.

(21) Appl. No.: 19/008,193

(22) Filed: Jan. 2, 2025

(65) Prior Publication Data

US 2025/0166635 A1 May 22, 2025

Related U.S. Application Data

(63) Continuation of application No. 17/915,329, filed as application No. PCT/JP2021/011494 on Mar. 19, 2021, now Pat. No. 12,190,894.

(30) Foreign Application Priority Data

Apr. 29, 2020 (JP) ................................ 2020-079874

(51) Int. Cl.

| | |
|---|---|
| ***G10L 19/002*** | (2013.01) |
| ***A63F 13/211*** | (2014.01) |
| ***A63F 13/214*** | (2014.01) |
| ***A63F 13/215*** | (2014.01) |
| ***A63F 13/218*** | (2014.01) |
| ***A63F 13/23*** | (2014.01) |

(Continued)

(52) U.S. Cl.

CPC .......... *G10L 19/002* (2013.01); *A63F 13/211* (2014.09); *A63F 13/215* (2014.09);

(Continued)

(58) Field of Classification Search

CPC . G10L 19/002; G11B 20/1426; A63F 13/214; A63F 13/215; A63F 13/218;

(Continued)

(56) References Cited

U.S. PATENT DOCUMENTS 9,122,330 B2 * 9/2015 Bau ...................... G06F 3/0488
10,140,822 B2 11/2018 Bharitkar (Continued)

FOREIGN PATENT DOCUMENTS

EP 2806353 A1 11/2014
JP 2008-123431 A 5/2008

(Continued)

OTHER PUBLICATIONS

Jea-young Lee, et al., "Signal Processing Techniques for Haptic Data Compression in Teleoperation Systems", 2012 IEEE Haptics Symposium, Mar. 4-7, 2012, pp. 371-376.

*Primary Examiner* — Khai M Nguyen
(74) *Attorney, Agent, or Firm* — Paratus Law Group, PLLC

(57) ABSTRACT

An object is to reduce the amount of data to be transmitted while ensuring tactile reproducibility. A decoding device according to the present technology includes: a first decoding unit that decodes first encoded data obtained by encoding a first signal section with a first bit rate, the first signal section being a part of a touch signal section which is a signal section indicating a touch state with an object in a tactile signal, the first signal section being a signal section including a boundary between the touch state and a non-touch state with the object; and a second decoding unit that decodes second encoded data obtained by encoding a second signal section with a bit rate lower than the first bit rate, the second signal section being a signal section except for the first signal section in the touch signal section.

16 Claims, 19 Drawing Sheets

(51) Int. Cl.

| | |
|---|---|
| ***A63F 13/332*** | (2014.01) |
| ***A63F 13/42*** | (2014.01) |
| ***G06F 3/01*** | (2006.01) |
| ***G11B 20/14*** | (2006.01) |
| ***H03M 7/30*** | (2006.01) |

(52) U.S. Cl.

CPC ............ *A63F 13/218* (2014.09); *A63F 13/23* (2014.09); *A63F 13/332* (2014.09); *A63F 13/42* (2014.09); *G06F 3/011* (2013.01); *G06F 3/016* (2013.01); *G11B 20/1426* (2013.01); *A63F 13/214* (2014.09); *G06F 2203/013* (2013.01); *H03M 7/70* (2013.01)

(58) Field of Classification Search

CPC ........ A63F 13/23; A63F 13/332; A63F 13/42; A63F 13/211; G06F 2203/013; G06F 3/011; G06F 3/016; H03M 7/70

See application file for complete search history.

(56) References Cited

U.S. PATENT DOCUMENTS

| | | | |
|---|---|---|---|
| 10,261,582 B2 | 4/2019 | Saboune et al. | |
| 2011/0032088 A1 * | 2/2011 | Kim ..................... | H04N 19/467 340/407.1 |
| 2019/0043322 A1 | 2/2019 | Tachi | |

FOREIGN PATENT DOCUMENTS

| | | | |
|---|---|---|---|
| JP | 2014-239430 | A | 12/2014 |
| JP | 2016-202486 | A | 12/2016 |
| WO | WO 2011/027535 | A1 | 3/2011 |
| WO | WO-2017175868 | A1 | 10/2017 |
| WO | WO-2020003727 | A1 | 1/2020 |
| WO | WO-2020008716 | A1 | 1/2020 |
| WO | WO-2020031483 | A1 | 2/2020 |
| WO | WO-2020031497 | A1 | 2/2020 |

* cited by examiner

DECODING DEVICE, DECODING METHOD, PROGRAM, ENCODING DEVICE, AND ENCODING METHOD

CROSS REFERENCE TO PRIOR APPLICATION

This application is a continuation of U.S. patent application Ser. No. 17/915,329 (filed on Sep. 28, 2022), which is a National Stage Patent Application of PCT International Patent Application No. PCT/JP2021/011494 (filed on Mar. 19, 2021) under 35 U.S.C. § 371, which claims priority to Japanese Patent Application No. 2020-079874 (filed on Apr. 29, 2020), which are all hereby incorporated by reference in their entirety.

TECHNICAL FIELD

The present technology relates to a decoding device that decodes an encoded tactile signal, a decoding method thereof, a program of the decoding device, an encoding device that encodes a tactile signal, an encoding method thereof, and a program of the encoding device.

BACKGROUND ART

In recent years, there has been developed a technology in which a device mounted on a user vibrates to give a tactile stimulus to the user. Here, the tactile stimulus refers to a physical phenomenon that causes the user to perceive a tactile sensation due to a vibration phenomenon or the like. In addition, generating a tactile stimulus is referred to as a tactile presentation.

Technologies for tactile presentation are used in devices in various fields. For example, in a terminal device with a touch panel such as a smartphone, the touch panel vibrates in response to a touch operation from the user and gives a tactile stimulus to the user's finger, so that the user can feel a touch on a button or the like displayed on the touch panel. Further, for example, in a music listening device such as headphones, a tactile stimulus is given in time with music playback, so that the deep bass in the music being played back can be boosted. Further, for example, in a device that provides a computer game or VR (Virtual Reality), a controller or the like is vibrated according to an operation of the controller or a scene of the content to give a tactile stimulus to the user, so that the immersive feeling of the user in the content can be enhanced.

In addition, there has been developed a technology for giving a tactile stimulus to a user based on a tactile signal received from an external device. For example, PTL 1 referred to below discloses a technology for giving a tactile stimulus to a user with the frequency and amplitude of vibration being changed based on a received signal.

CITATION LIST

Patent Literature

PTL 1

JP 2016-202486 A

SUMMARY

Technical Problem

Here, it is considered that when performing a tactile presentation for a plurality of parts of the user's body, it is necessary to prepare a tactile signal for each of the channels corresponding to the respective parts of the user. In this case, it is assumed that the total amount of tactile signal data required increases as the number of parts to which tactile stimuli are given increases. In addition, even when the frequency range of the vibration included in the tactile signal is widened, the total amount of tactile signal data required increases. Therefore, the transmission and reception of tactile signals may be delayed due to the congestion state of a network used for the transmission and reception of the tactile signals.

The present technology has been made in view of the above circumstances, and aims to achieve both a reduced amount of data to be transmitted and a guarantee of reproduction of tactile sensation.

Solution to Problem

A decoding device according to the present technology includes: a first decoding unit that decodes first encoded data obtained by encoding a first signal section with a first bit rate, the first signal section being a part of a touch signal section which is a signal section indicating a touch state with an object in a tactile signal, the first signal section being a signal section including a boundary between the touch state and a non-touch state with the object; and a second decoding unit that decodes second encoded data obtained by encoding a second signal section with a bit rate lower than the first bit rate, the second signal section being a signal section except for the first signal section in the touch signal section. As a result, it is possible to appropriately decode encoded tactile data in which only the significant section in the touch signal section is encoded with the high bit rate and the other section is encoded with the low bit rate, so that both a reduced amount of data to be transmitted and a guarantee of reproduction of tactile sensation can be achieved.

The decoding device according to the present technology described above may include a combining unit that combines first waveform data obtained by decoding the first encoded data and second waveform data obtained by decoding the second encoded data.

As a result, the pieces of waveform data are integrated into one piece of waveform data.

In the decoding device according to the present technology described above, the combining unit may perform cross-fade processing on a combined portion between the first waveform data and the second waveform data.

As a result, the first waveform data and the second waveform data are smoothly combined.

A decoding method according to the present technology includes: decoding first encoded data obtained by encoding a first signal section with a first bit rate, the first signal section being a part of a touch signal section which is a signal section indicating a touch state with an object in a tactile signal, the first signal section being a signal section including a boundary between the touch state and a non-touch state with the object; and decoding second encoded data obtained by encoding a second signal section with a bit rate lower than the first bit rate, the second signal section being a signal section except for the first signal section in the touch signal section.

With such a decoding method, the same operation as that of the above-described decoding device according to the present technology can also be obtained.

A first program according to the present technology is a program causing an information processing device to execute: a function of decoding first encoded data obtained by encoding a first signal section with a first bit rate, the first signal section being a part of a touch signal section which is a signal section indicating a touch state with an object in a tactile signal, the first signal section being a signal section including a boundary between the touch state and a non-touch state with the object; and a function of decoding second encoded data obtained by encoding a second signal section with a bit rate lower than the first bit rate, the second signal section being a signal section except for the first signal section in the touch signal section.

Such a first program according to the present technology realizes the above-described decoding device according to the present technology.

An encoding device according to the present technology includes: a determination unit that determines a first signal section and a second signal section, the first signal section being a part of a touch signal section which is a signal section indicating a touch state with an object in a tactile signal, the first signal section being a signal section including a boundary between the touch state and a non-touch state with the object, the second signal section being a signal section except for the first signal section in the touch signal section; a first encoding unit that encodes the first signal section with a first bit rate; and a second encoding unit that encodes the second signal section with a bit rate lower than the first bit rate. As a result, only the significant section in the touch signal section is encoded with the high bit rate, and the other section is encoded with the low bit rate.

In the encoding device according to the present technology described above, the determination unit may determine the first signal section and the second signal section based on section information on the first signal section and the second signal section added to the tactile signal.

As a result, waveform analysis processing is not necessary in determining the first signal section and the second signal section.

In the encoding device according to the present technology described above, the determination unit may determine the first signal section and the second signal section based on a result of performing a waveform analysis on the tactile signal. As a result, information for differentiating between the first signal section and the second signal section is not required to be added to the touch signal in individually encoding the first signal section and the second signal section.

In the encoding device according to the present technology described above, the determination unit may determine the first signal section and the second signal section based on an amplitude change rate of the tactile signal.

As a result, it is possible to appropriately determine the first signal section with a sharp change in the waveform of the tactile signal.

In the encoding device according to the present technology described above, the second encoding unit may encode the second signal section by an encoding method using a longer conversion length than in encoding for the first signal section.

As a result, the amount of second encoded data in the second signal section is reduced.

In the encoding device according to the present technology described above, the second encoding unit may perform parametric encoding on the second signal section.

As a result, the amount of second encoded data in the second signal section is reduced.

The encoding device according to the present technology described above may include a first buffer memory used for determining the first signal section and the second signal section, and a second buffer memory used for encoding the second signal section according to a result of determining.

As a result, it is possible for a second buffering processing unit to buffer a tactile signal that fails to be buffered by a first buffering processing unit for the tactile signal in the second signal section for which the conversion length is longer than in the encoding for the first signal section.

An encoding method according to the present technology includes: determining a first signal section and a second signal section, the first signal section being a part of a touch signal section which is a signal section indicating a touch state with an object in a tactile signal, the first signal section being a signal section including a boundary between the touch state and a non-touch state with the object, the second signal section being a signal section except for the first signal section in the touch signal section; encoding the first signal section with a first bit rate; and encoding the second signal section with a bit rate lower than the first bit rate.

With such an encoding method, the same operation as that of the above-described encoding device according to the present technology can also be obtained.

A second program according to the present technology is a program causing an information processing device to execute: a function of determining a first signal section and a second signal section, the first signal section being a part of a touch signal section which is a signal section indicating a touch state with an object in a tactile signal, the first signal section being a signal section including a boundary between the touch state and a non-touch state with the object, the second signal section being a signal section except for the first signal section in the touch signal section; a function of encoding the first signal section with a first bit rate; and a function of encoding the second signal section with a bit rate lower than the first bit rate.

Such a second program according to the present technology realizes the above-described encoding device according to the present technology.

DESCRIPTION OF EMBODIMENTS

Figure 1:
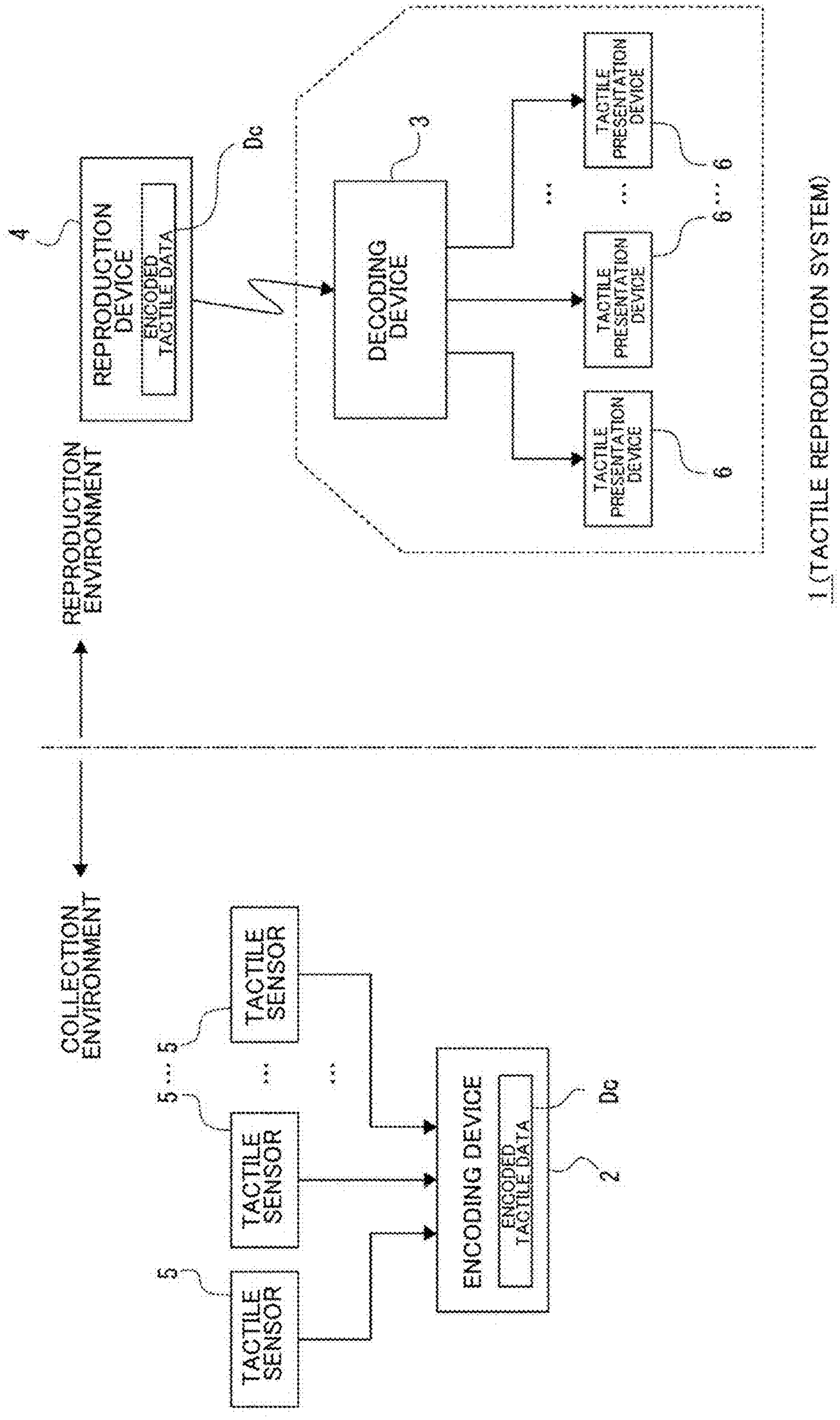
FIG. 1 is a diagram illustrating a configuration example of a tactile reproduction system according to an embodiment of the present technology.

Embodiments of the present technology will be described with reference to the above-mentioned drawings The description of the drawings for the configuration, if previously described, may be referred to with the same reference numerals and the description thereof may be omitted. In addition, the drawings are schematic, and the main parts necessary for describing the present technology and the related configurations are extracted for illustration. The relationship between the thickness, plane dimensions, ratios, and the like of the structures illustrated in the drawings are merely examples, and various changes can be made according to, for example, their designs, as long as they do not depart from the technical idea of the present technology.

Hereinafter, an embodiment will be described in the following order.

<1. Overview of tactile reproduction system>
<2. Configuration of encoding device>
<3. Configuration of reproduction device>
<4. Configuration of decoding device>
<5. Usage examples of tactile reproduction system>
<6. Tactile reproduction method as embodiment>
[6-1. Issues related to tactile signal transmission]
[6-2. Encoding method]
[6-3. Decoding method]
<7. First application example>
<8. Second application example>
<9. Third application example>
<10. Conclusion>
<11. Present technology>

The terms as used herein are now defined as follows.

Tactile stimulus: A physical phenomenon that causes a person to perceive a tactile sensation, such as a vibration phenomenon.

Tactile presentation: Generating a tactile stimulus.

Tactile signal: A signal that represents a pattern of tactile stimulus, such as a signal that represents a vibration waveform.

Recipient: A person who receives a tactile presentation.

Tactile characteristics: Human tactile characteristics. It depends on a part (hand, face, foot, etc.).

Tactile sensitivity: A sensitivity of how strong the tactile stimulus is subjectively perceived. It depends on a receptor or part of the human body. A high tactile sensitivity means that it is easy to perceive tactile signals.

Encoded tactile data: Data in which a tactile signal is encoded. It includes a stream and a frame, which are subordinate concepts. The encoded tactile data includes first encoded data and second encoded data, which will be described later.

1. Overview of Tactile Reproduction System

FIG. 1 illustrates a configuration example of a tactile reproduction system 1 including an encoding device 2 and a decoding device 3, as an embodiment according to the present technology.

First, in the present embodiment, environment for realizing tactile reproduction is classified into: a collection environment in which a tactile signal obtained by sensing tactile information (tactile stimulus) as a target is encoded, and the encoded tactile data Dc obtained by encoding is collected; and a reproduction environment in which the tactile information is reproduced based on a tactile signal obtained by decoding encoded tactile data Dc.

As illustrated, the tactile reproduction system 1 includes in the collection environment a plurality of tactile sensors 5 and an encoding device 2 to which the tactile sensors 5 are connected, and includes in the reproduction environment a reproduction device 4 configured to acquire encoded tactile data Dc, a decoding device 3 configured to enable wireless communication with the reproduction device 4, and a plurality of tactile presentation devices 6 connected to the decoding device 3.

Each tactile sensor 5 is a sensor that senses a tactile stimulus, and in the present example, a vibration sensor such as a piezo pickup or an acceleration sensor is used. The tactile sensor outputs vibration or motion as a voltage change when brought into touch with an object to be sensed, that is, the human body in the present example.

In the present example, the tactile sensors 5 are in wired connection to the encoding device 2, and the tactile sensors 5 are mounted on different parts of the human body as the object and senses a tactile stimulus generated at each part. The parts on which the tactile sensors 5 are mounted are not limited to those of the human body, and a tactile sensor 5 may be mounted on a tool or the like used in the tactile reproduction system 1. In this case, the tactile sensor 5 senses a tactile stimulus generated at the corresponding part on which the tool as an object is mounted.

The encoding device 2 is configured to include, for example, a computer device such as a central processing unit (CPU) or a digital signal processor (DSP), encodes a detection signal (tactile signal) from each tactile sensor 5 according to a predetermined data format, and collects the encoded tactile data Dc obtained by encoding in, for example, a storage device internally provided.

The reproduction device 4 is configured to include a computer device such as a CPU and a DSP, and transmits the acquired encoded tactile data Dc to the decoding device 3. For example, the encoded tactile data Dc collected in the collection environment is acquired by the reproduction device 4 via a required network such as the Internet. Alternatively, the encoded tactile data Dc may be recorded in a portable recording medium, and the reproduction device 4 may acquire the encoded tactile data Dc via the recording medium.

The decoding device 3 decodes the encoded tactile data Dc received from the reproduction device 4, and drives each tactile presentation device 6 based on the tactile signal obtained by decoding.

The tactile presentation device 6 is a device that generates a tactile stimulus, and in the present example, a vibration device such as a vibrator or an actuator is used.

In the present example, the respective tactile presentation devices 6 are mounted on different parts of the human body of the recipient, and are each adapted to reproduce the tactile stimulus sensed by the corresponding tactile sensor 5.

Here, in the present example, the tactile presentation devices 6 are in wired connection to the decoding device 3, and a configuration surrounded by a broken line in the figure, that is, the configuration including the decoding device 3 and the tactile presentation devices 6, is to be mounted.

In the tactile reproduction system 1, the reproduction device 4 may be configured to have the function of the decoding device 3 so that the reproduction device 4 and the tactile presentation devices 6 are in wired connection to each other.

However, with such a configuration, there is a risk of causing annoyance to the recipient on which the tactile presentation devices 6 are mounted. This annoyance is expected to increase as the number of parts where tactile stimuli are to be given increases.

With the configuration of the tactile reproduction system 1 illustrated in FIG. 1, it is possible to prevent such annoyance from being given to the recipient.

The tactile reproduction system 1 illustrated in FIG. 1 is configured to be a system that reproduces on the recipient the tactile sensation of each part perceived by a person on which the tactile sensors 5 are mounted, and is also configured to be a system applicable to the case where they are remote from each other.

2. Configuration of Encoding Device

Figure 2:
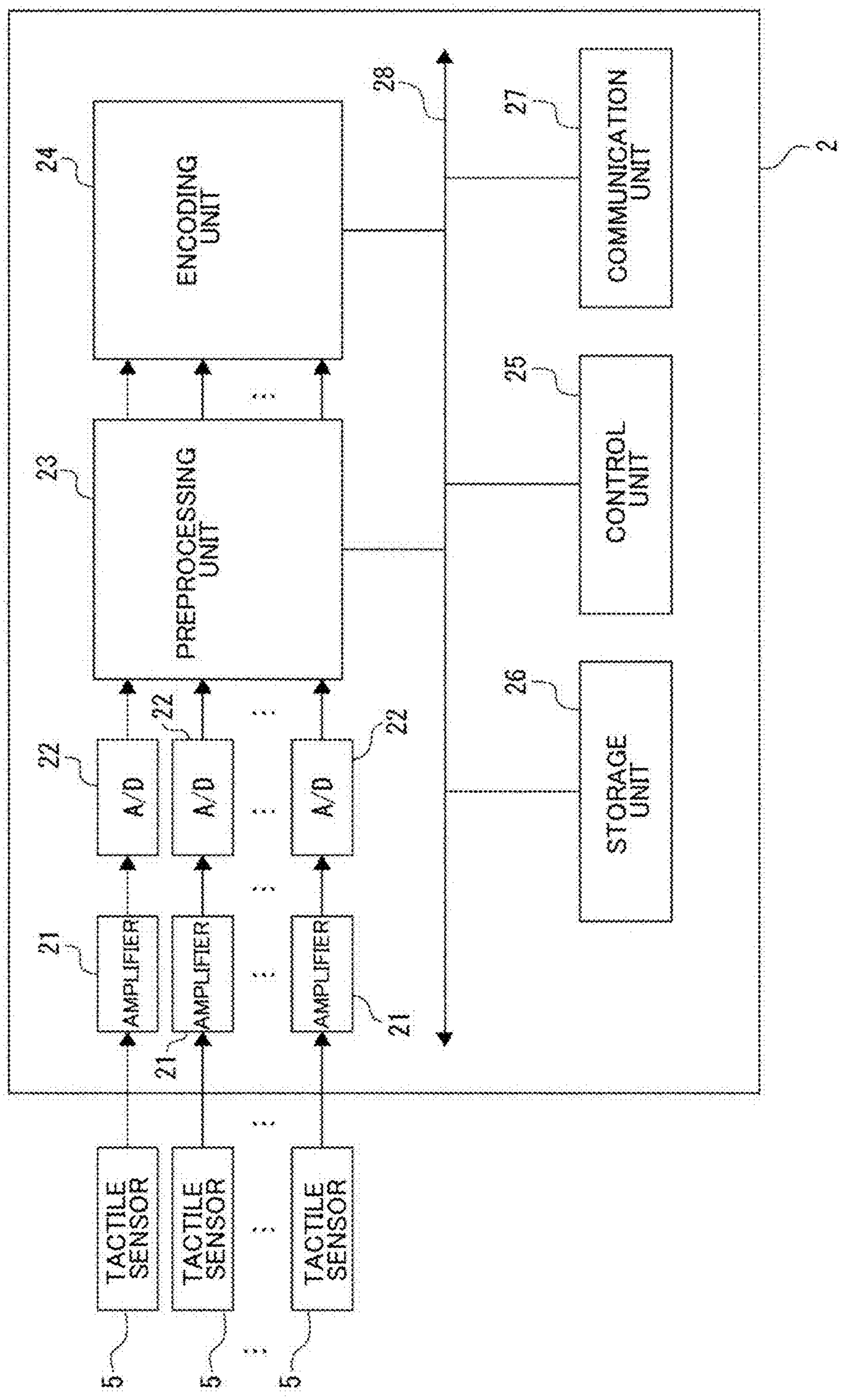
FIG. 2 is a diagram illustrating a configuration example of an encoding device according to an embodiment.

FIG. 2 is a diagram illustrating of an internal configuration example of the encoding device 2. FIG. 2 also illustrates the tactile sensors 5 illustrated in FIG. 1 together with the internal configuration example of the encoding device 2.

As illustrated, the encoding device 2 includes a plurality of amplifiers 21, a plurality of analog/digital (A/D) converters 22, a preprocessing unit 23, an encoding unit 24, a control unit 25, a storage unit 26, a communication unit 27, and a bus 28. The preprocessing unit 23, the encoding unit 24, the control unit 25, the storage unit 26, and the communication unit 27 are connected via the bus 28 so that they can communicate data with each other.

The detection signal from each tactile sensor 5 is input to the corresponding amplifier 21 and adjusted to an appropriate dynamic range, and then input to the corresponding A/D converter 22 to be subjected to A/D conversion (analog/digital conversion).

Each detection signal subjected to the A/D conversion (that is, a tactile signal for each part) is input to the preprocessing unit 23. The preprocessing unit 23 performs various types of digital signal processing such as noise reduction and calibration of the sensor characteristics of the tactile sensor 5. Each tactile signal subjected to the signal processing by the preprocessing unit 23 is input to the encoding unit 24.

The encoding unit 24 includes, for example, a DSP, and encodes each input tactile signal according to a predetermined data format to obtain the above-mentioned encoded tactile data Dc.

Details of encoding the tactile signal as the present embodiment will be described again.

The control unit 25 is configured to include a microcomputer including, for example, a CPU, a read only memory (ROM), a random access memory (RAM), and the like, and performs the overall control of the encoding device 2 by executing, for example, processing according to a program stored in the ROM. For example, the control unit 25 performs data communication with an external device via the communication unit 27.

The communication unit 27 is configured to perform data communication with an external device via a network such as the Internet, and the control unit 25 is configured to perform data communication with the external device connected to the network via the communication unit 27. In particular, the control unit 25 is configured to cause the communication unit 27 to transmit the encoded tactile data Dc obtained by the encoding unit 24 to the external device.

The storage unit 26 comprehensively represents a storage device such as a hard disk drive (HDD) or a solid state drive (SSD), and is used for various types of data storage in the encoding device 2. For example, the storage unit 26 stores data necessary for control performed by the control unit 25. Further, the encoded tactile data Dc obtained by the encoding unit 24 may be stored in the storage unit 26 under the control of the control unit 25.

3. Configuration of Reproduction Device

Figure 3:
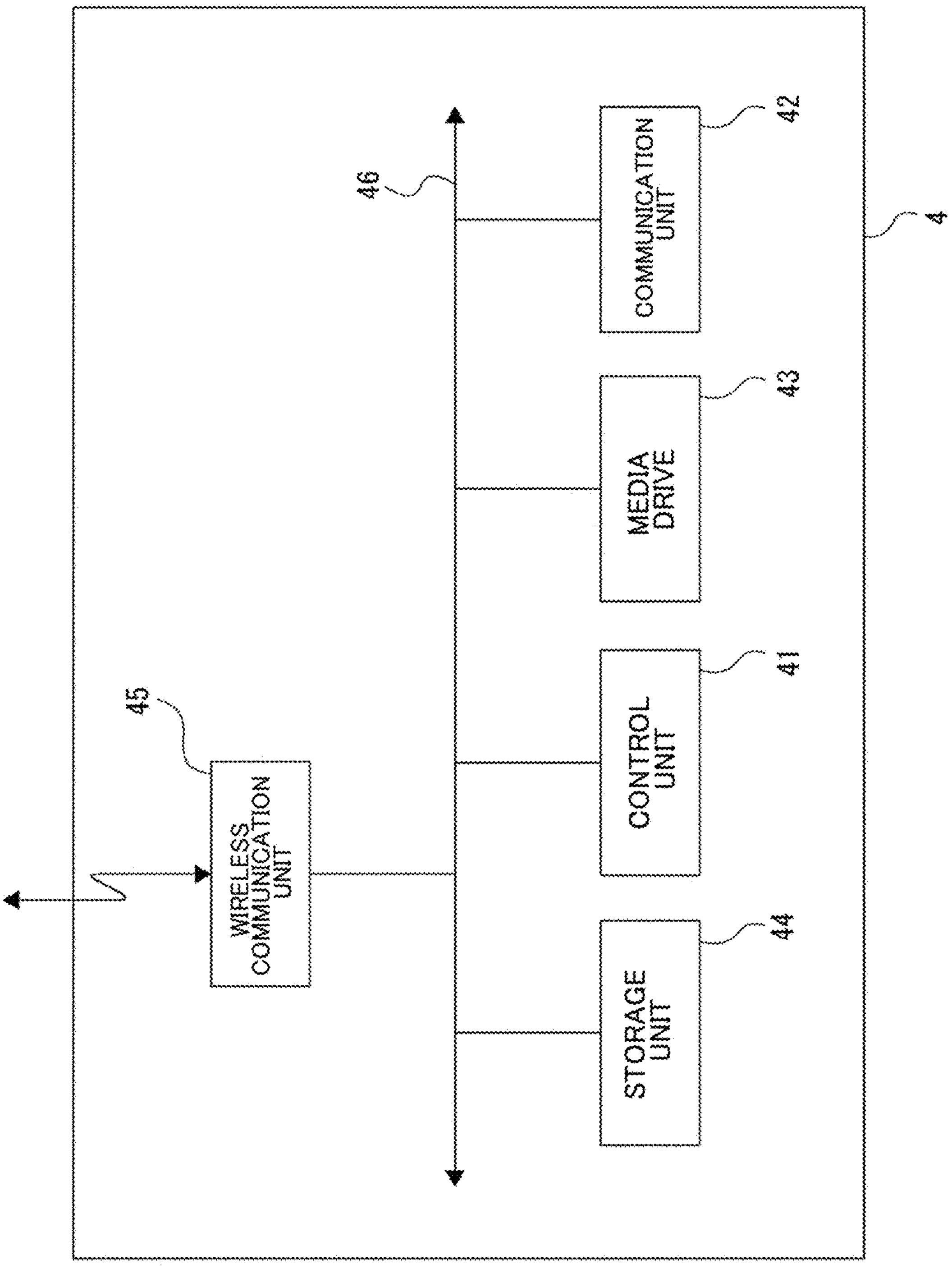
FIG. 3 is a diagram illustrating a configuration example of a reproduction device according to an embodiment.

FIG. 3 is a diagram illustrating an internal configuration example of the reproduction device 4. As illustrated, the reproduction device 4 includes a control unit 41, a communication unit 42, a media drive 43, a storage unit 44, and a wireless communication unit 45, and also includes a bus 46 that connects these units so that they can communicate data with each other.

The control unit 41 is configured to include, for example, a microcomputer having a CPU, a ROM, a RAM, and the like, and controls the entire reproduction device 4.

The communication unit 42 is configured to perform data communication with an external device via a network such as the Internet.

The control unit 41 is configured to perform data communication with the external device connected to the network via the communication unit 42. In particular, the control unit 41 is configured to cause the communication unit 42 to receive the encoded tactile data Dc from an external device such as a server device on the network.

The media drive 43 is configured to allow a portable recording medium to be loaded and unloaded, and is also configured as a reader/writer unit in which data can be written to and read from the loaded recording medium. Examples of the recording medium supported by the media drive 43 include a memory card (for example, a portable flash memory), an optical disk recording medium, and the like. This media drive 43 makes it possible to read out the encoded tactile data Dc recorded in the portable recording medium.

The storage unit 44 comprehensively represents a storage device such as an HDD or an SSD, and is used for various types of data storage in the reproduction device 4. For example, the storage unit 44 stores data necessary for control performed by the control unit 41. Further, under the control of the control unit 41, the encoded tactile data Dc read by the media drive 43 and the encoded tactile data Dc received from the external device by the communication unit 42 can be stored in the storage unit 44.

The wireless communication unit 45 performs short-range wireless communication by a predetermined type of communication such as Bluetooth (registered trademark).

Here, the control unit 41 performs a control for causing the communication unit 42 to receive the encoded tactile data Dc and a control for causing the media drive 43 to read out the encoded tactile data Dc, as parts of the above-mentioned overall control. The control unit 41 also performs a control for causing the wireless communication unit 45 to transmit the encoded tactile data Dc obtained via the communication unit 42 or the media drive 43 to the decoding device 3.

4. Configuration of Decoding Device

Figure 4:
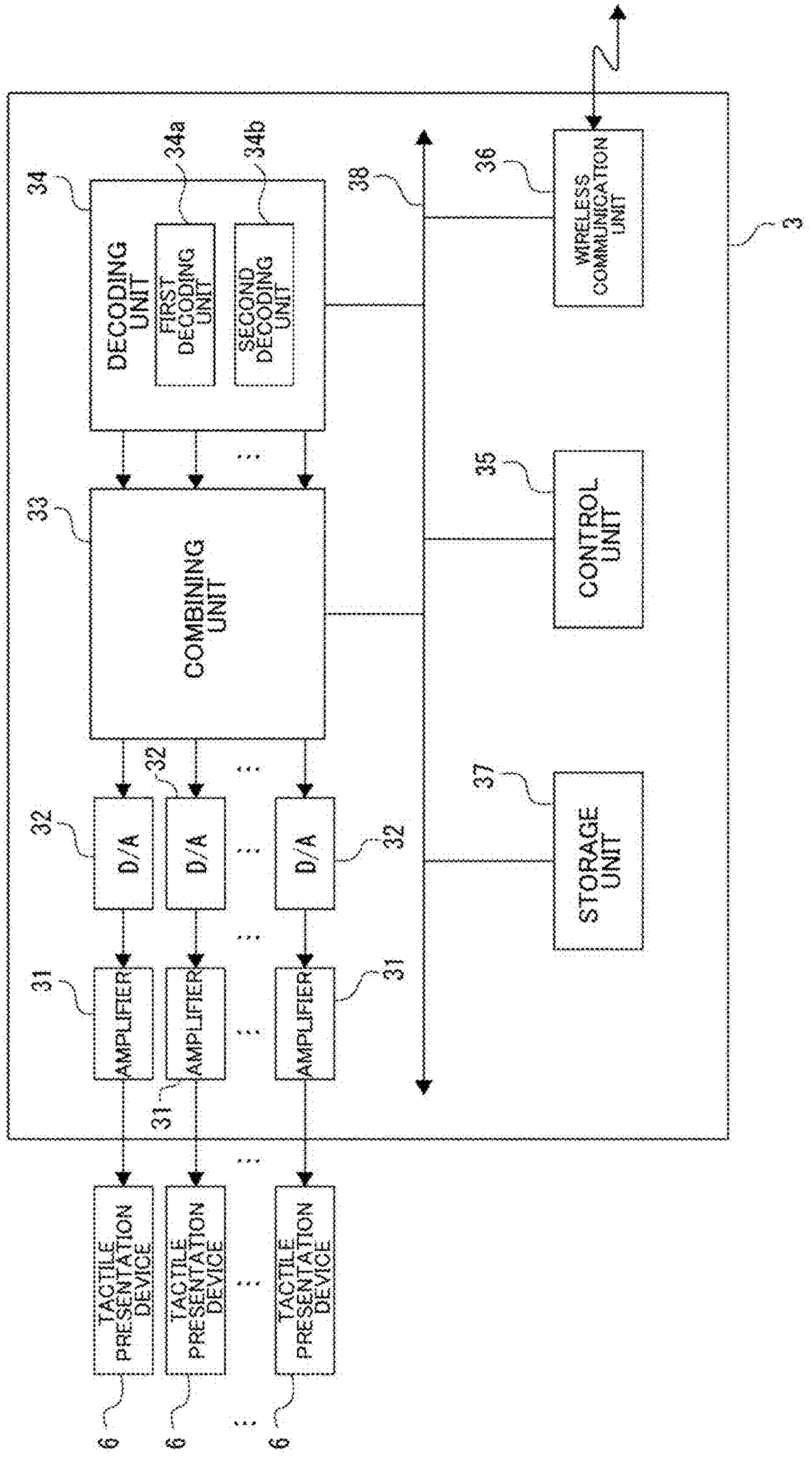
FIG. 4 is a diagram illustrating a configuration example of a decoding device according to an embodiment.

FIG. 4 is a diagram for describing an internal configuration example of the decoding device 3, and illustrates the tactile presentation devices 6 together with the internal configuration example of the decoding device 3.

As illustrated, the decoding device 3 includes a plurality of amplifiers 31, a plurality of digital/analog (D/A) converters 32, a combining unit 33, a decoding unit 34, a control unit 35, a wireless communication unit 36, a storage unit 37, and a bus 38. The combining unit 33, the decoding unit 34, the control unit 35, the wireless communication unit 36, and the storage unit 37 are connected via the bus 38 so that they can communicate data with each other.

The control unit 35 is configured to include, for example, a microcomputer having a CPU, a ROM, a RAM, and the like, and controls the entire decoding device 3.

The wireless communication unit 36 performs short range wireless communication by a method for communicating with the wireless communication unit 45 in the reproduction device 4, such as Bluetooth. The encoded tactile data Dc transmitted from the reproduction device 4 is received by the wireless communication unit 36.

The storage unit 37 is, for example, a storage device similar to the storage unit 26 of the encoding device 2 or the storage unit 44 of the reproduction device 4, and is used for storing various types of data used by the control unit 35 and the like.

The decoding unit 34 decodes the encoded tactile data Dc received via the wireless communication unit 36 by a method described later to obtain a tactile signal for each part. The tactile signal for each part obtained by the decoding unit 34 is input to the combining unit 33.

The combining unit 33 performs signal processing, such as calibration of the tactile presentation device 6 and predetermined filter processing, on the received tactile signal for each part, if necessary.

Details of decoding the encoded tactile data Dc as the present embodiment will be described again.

Each tactile signal that has passed through the combining unit 33 is input to the corresponding D/A converter 32 to be subjected to D/A conversion (digital/analog conversion), then adjusted to an appropriate dynamic range in the corresponding amplifier 31, and output to the corresponding tactile presentation device 6. As a result, each tactile presentation device 6 is driven based on the corresponding tactile signal, and a tactile stimulus to be sensed in the detection environment can be given to the recipient (that is, the tactile information can be reproduced).

Although only the tactile signal is mentioned above, a configuration can be provided in which an audio signal and a video signal are collected together with the tactile signal to provide the recipient with the sound and the image together with the tactile information.

5. Usage Examples of Tactile Reproduction System

Figure 5:
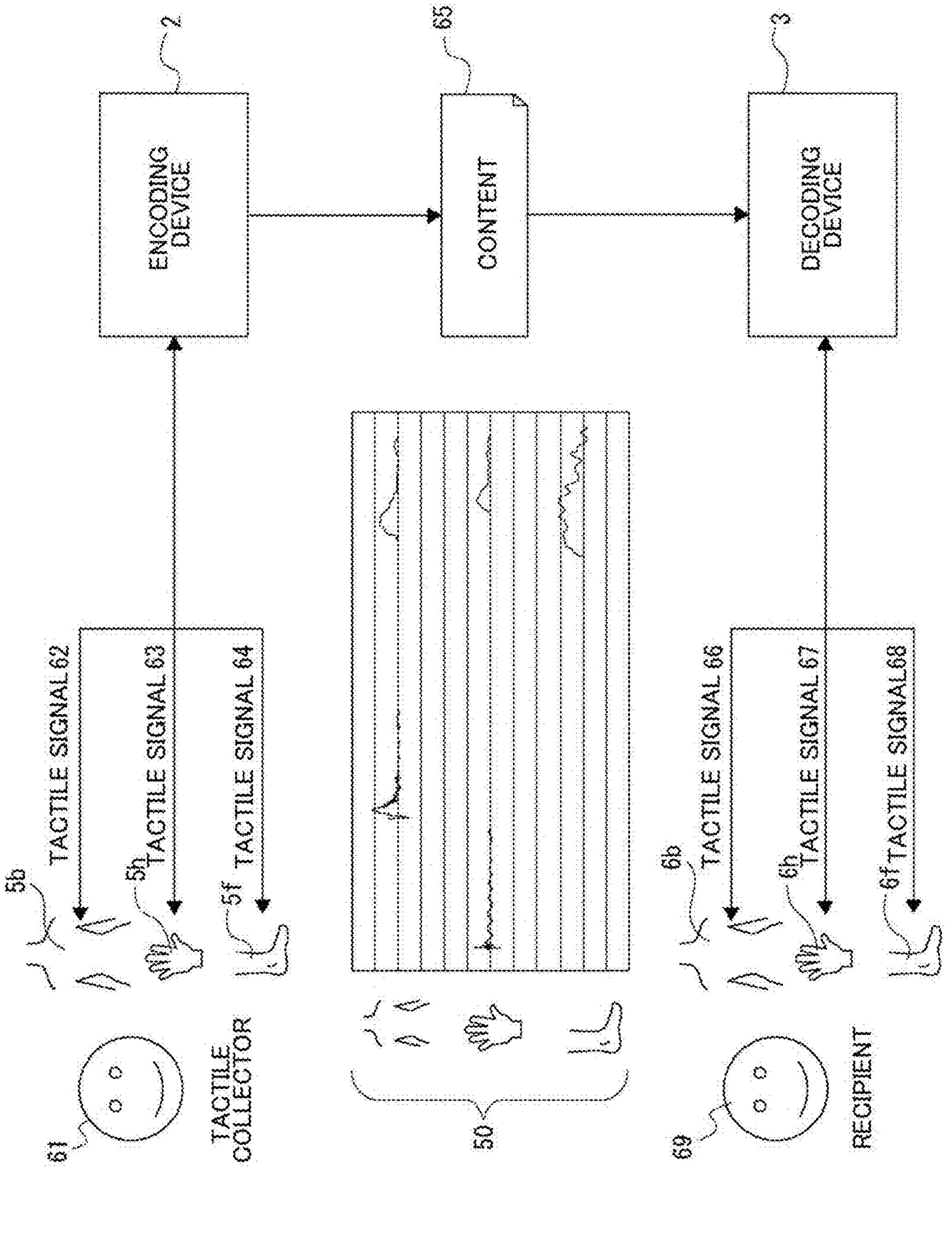
FIG. 5 is a diagram illustrating a usage example of the tactile reproduction system according to an embodiment of the present technology.

Consider reproducing a content for presenting a tactile sensation in addition to video. FIG. 5 is an illustrative diagram of a usage example of the tactile reproduction system 1.

In FIG. 5, at the time of content production, in addition to the video, the encoded tactile data Dc in which the encoding device 2 encodes the tactile signals (including a body tactile signal 62, a finger tactile signal 63, a foot tactile signal 64) collected from the tactile sensors 5 (including a tactile sensor **5*b* for the body, a tactile sensor 5*h* for the fingers, and the tactile sensor 5*f* for the foot in the figure) mounted on a tactile collector 61 is recorded in synchronization with the video, and the resulting data is stored as a content 65 in the storage unit 44 of the reproduction device 4**.

At the time of reproduction, the content 65 is transmitted from the storage unit 44 to the decoding device 3 through the wireless communication unit 45, and the content 65 received by the wireless communication unit 36 is decoded by the decoding unit 34. As a result, it is possible to present the tactile signals (including a body tactile signal 66, a finger tactile signal 67, a foot tactile signal 68) corresponding to the tactile presentation devices 6 (including a tactile presentation device **6*b* for the body, a tactile presentation device 6*h* for the fingers, and a tactile presentation device 6*f* for the foot in the figure) mounted on a recipient 69, through the tactile presentation devices 6**.

Examples of scenes where the tactile presentation is actually performed in the video include a scene in which a character beats (or is beaten), a scene where a character shoots (or is shot) with a gun, a scene where a character receives a blast, and a scene where a character feels the shaking of the ground. In the figure, as an example of the tactile signals in the actual content 65, a waveform example 50 of the body, finger, and foot tactile signals is illustrated. In the waveform example 50, the tactile signals obtained by the tactile sensors 5 (the tactile sensor **5*b*, the tactile sensor 5*h*, the tactile sensor 5*f*) mounted on the three parts, the body, fingers, and foot of the tactile collector 61** are illustrated.

Describing in chronological order, first, vibration caused by the reaction due to bullet firing is generated on the fingers in the scene where the tactile collector 61 shoots an opponent with a gun, then vibration caused by the impact of the shot body is generated in the body in the scene where the opponent also shoots at the tactile collector's body with a gun, and after that, vibration of the ground is gradually propagated to the foot, body, and fingers in the scene where an earthquake occurs. For example, when such a content is reproduced, the recipient 69 can feel high-quality reality by reproducing the tactile sensation with the vibration in addition to the video and audio.

6. Tactile Reproduction Method as Embodiment

[6-1. Issues Related to Tactile Signal Transmission]

Hereinafter, a tactile reproduction method as an embodiment will be described. First, the tactile reproduction method as the embodiment is a method focusing on human tactile characteristics.

Figure 6:
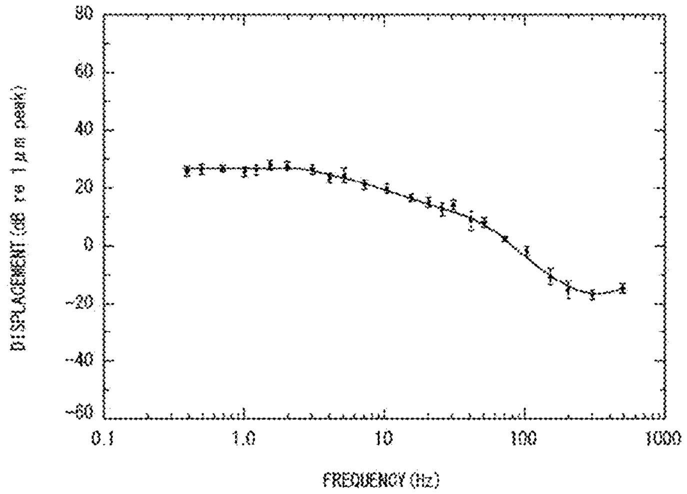
FIG. 6 is a diagram illustrating a vibration detection threshold curve that serves as a guideline for human tactile sensitivity according to an embodiment.

A vibration detection threshold curve illustrated in FIG. 6 has been reported as a guideline for human tactile sensitivity. In the figure, the horizontal axis represents the frequency and the vertical axis represents the magnitude of a tactile stimulus (vibration: displacement in this example). The vibration detection threshold curve in FIG. 6 is based on the experimental results of "Four channels mediate the mechanical aspects of touch S. J., Bolanowski 1988". The illustrated vibration detection threshold curve is an example of experimentally examining whether or not human beings feel the vibration as a tactile sensation, that is, a tactile sensitivity. Human beings cannot perceive vibrations lower than this curve as tactile sensations.

As can be seen from FIG. 6, the frequency with the highest tactile sensitivity of human beings is generally about 200 Hz. Therefore, devices and applications that generate vibrations are often designed to generate vibrations up to about 200 Hz.

On the other hand, although not shown in the results of FIG. 6, it is commonly known that human beings can perceive vibrations with a frequency of up to about 1 kHz as a tactile sensation. Human beings can perceive vibrations with a frequency component of about 1 kHz and vibrations without a frequency component of about 1 kHz as different tactile sensations.

For example, the vibration generated when a bottle is uncorked includes vibrations with frequencies of up to several kHz. When a user receives a vibration transmitted from a device that presents a tactile sensation as being up to several hundred Hz, the user cannot perceive that vibration as a tactile sensation when a bottle is uncorked with a sufficient sense of reality. Therefore, in order to give the user a tactile sensation with a deeper sense of reality, it is necessary to perform a tactile presentation with a vibration with frequencies of up to about 1 kHz.

However, as the width of frequencies included in a signal increases, the amount of data of the signal increases, so that a delay in transmission and reception of the signal is highly likely to occur. As a result, if the quality of a tactile sensation is improved, a situation may occur in which the tactile sensation cannot be presented at an appropriate timing.

The transmission and reception of a signal and a delay in tactile presentation will be described taking specific examples.

First, the amount of tactile signal data will be described. When a tactile signal is transmitted between devices, it is first converted to digital data. The capacity of digital data is represented by the number of bits required per unit time, that is, a bit rate B. Incidentally, the tactile sensitivity depends not only on the frequency of vibration but also on the amplitude. For example, the above-mentioned experimental results of FIG. 6 show that vibrations perceivable by human beings have an amplitude of about 50 dB (−20 dB to 30 dB) or more and a frequency of about 1000 Hz. In the following, it is assumed that the amplitude of vibration is about 70 dB, taking into consideration the actual distribution of tactile information perceivable by human beings.

When a tactile signal is digitized using Linear Pulse Code Modulation (LPCM), the amplitude of vibration that can be expressed by 1 bit is 6 dB. Accordingly, 12 bits are required for an amplitude of vibration of 70 dB. On the other hand, when the frequency of vibration is 1000 Hz, the sampling frequency needs to be doubled to 2000 Hz, and the bit rate B0 is obtained by the following [Equation 1].

$$B0 = 12\ \text{bit/sample} \times 2000\ \text{sample/sec} = 24\ \text{kbit/sec} \quad \text{[Equation 1]}$$

This value is very small compared with, for example, the bit rate of Compact Disc (CD)=700 kbps/ch, which is a typical format for audio signals. Accordingly, even if such a tactile signal is additionally incorporated into some system, it seems to be unlikely to cause a big problem.

However, as described above, it is known that the band of a tactile signal perceivable by human beings extends to several kHz. For example, when a tactile signal is reproduced with up to 2000 Hz, the bit rate is 48 kbit/sec, which is a double of that of [Equation 1].

The tactile sensation is present everywhere on the surface of the human body, unlike the sense of sight (two eyes) and the sense of hearing (two ears). Considering only the fingertips of both hands, there are 10 places, and when all their tactile signals are to be handled, the bit rate will be further increased by 10 times, which is 480 kbit/sec. As the places of interest increase to knuckles, palms, and so on, the bit rate increases dramatically.

Although a tactile signal is basically a one-dimensional signal, the physical phenomenon of vibration can be defined on three axes (x, y, z). If all of such axes are to be handled, a bit rate of 1440 kbit/sec, which is three times as much. This value is as high as more than 1411 kbit/sec for audio CD.

As described above, the total amount of tactile signal data required increases as the reproducibility of a tactile stimulus is improved and the number of user's parts given the tactile stimulus increases. Accordingly, the increase in the total amount of data becomes a heavy load on the network system that transmits the tactile signal.

Now consider a vibration generated by the motion of "tracing an object with the hand", which is significant in tactile sensation. This motion can be divided into three phases: a person touching the object, then moving the hand along the surface of the object, and finally releasing the hand from the object. Focusing on the vibration waveforms generated by this series of motions, the "moment of touch" and the "moment of release" are very short in time, but each have a sharp change in intensity. On the other hand, the vibration waveform during the motion of the hand along the surface of the object has a relatively long time scale and is steady.

In the present specification, a state of a part to be given a tactile signal touching an object, including a person touching the object and then moving the hand along the surface of the object until the person finally releases the hand from the object, is defined as a touch state. In addition, the state where a part to be given a tactile signal is not touching the object is defined as a non-touch state.

The section of a tactile signal generated by a series of motions of "tracing an object with the hand", that is, a signal section indicating a touch state with the object in the tactile signal is defined as a touch signal section.

In addition, in the touch signal section, a signal section including the boundary between the touch state and the non-touch state with the object, such as "the moment when the hand touches the object" or "the moment when the hand leaves the object", is defined as a first signal section. Further, in the touch signal section, a signal section except for the first signal section, such as "the state where the hand is placed on the object" or "the state where the hand is moving along the surface of the object", is defined as a second signal section.

Figure 7:
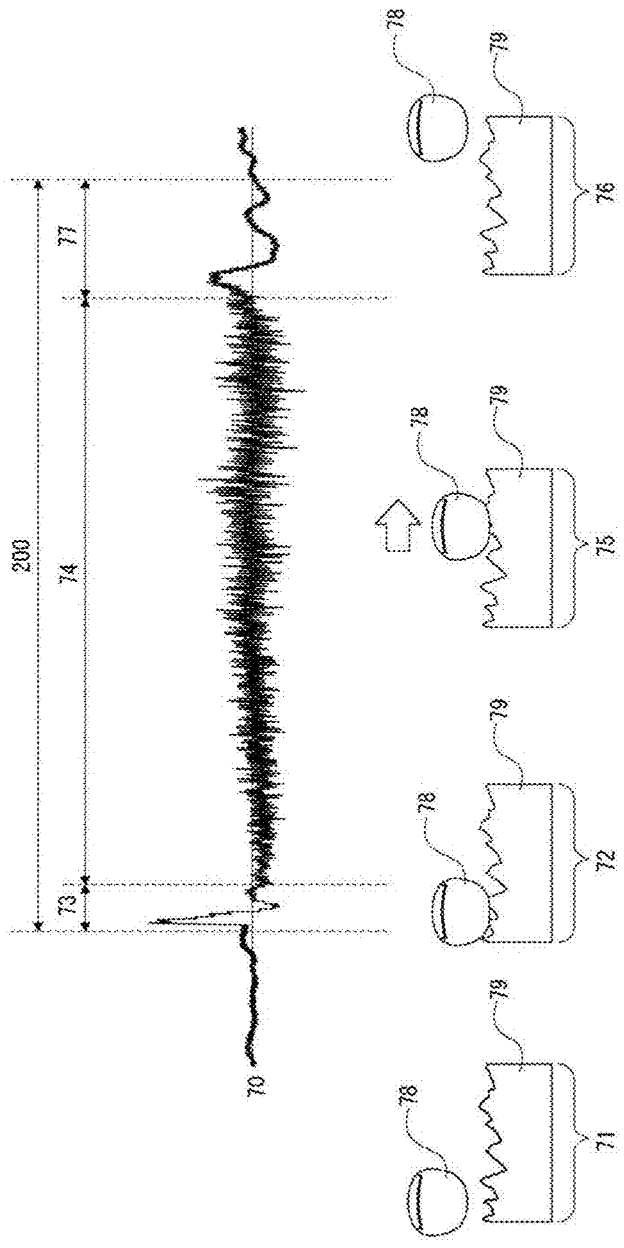
FIG. 7 is a diagram illustrating a vibration waveform of a tactile signal according to an embodiment.

FIG. 7 is a diagram illustrating a vibration waveform 70 of a tactile signal when a person traces an object 79 with a hand 78.

In the vibration waveform 70, a sharp pulse waveform like a signal section 73 is observed at the moment when the hand 78 illustrated in a scene 72 touches the object 79 after the state where the hand 78 illustrated in a scene 71 leaves the object 79. It is known that the vibration intensity, timing, pitch, waveform attenuation rate, and the like at this "moment of touch" may affect the perception of the hardness of the object and how fast the person touches the object 79. The signal section 73 including the boundary between the touch state and the non-touch state of the hand 78 and the object 79 is defined as the first signal section. This signal section 73 is very short in time.

On the other hand, as illustrated in the subsequent scene 75, for the hand 78 being moved on the object 79, the waveform of a signal section 74 with a gradual change in amplitude is observed. The vibration during this period affects the texture perception of the object 79 such as slippery and rough, and the pitch and amplitude of the waveform are significant factors.

The signal section 74 in the state where the touch state of the hand 78 and the object 79 is maintained is defined as the second signal section.

Finally, as illustrated in a scene 76, when the hand 78 leaves the object 79, the waveform of the corresponding signal section 77 is short in time and has a sharp change in intensity, and it is presumed to have properties similar to the waveform at the time of touch in the signal section 73. The signal section 77 including the boundary between the touch state and the non-touch state of the hand 78 and the object 79 is defined as the first signal section.

The series of signal sections including the signal section 73, the signal section 74, and the signal section 77 are referred to as a touch signal section 200 indicating a touch state with the object 79 in the tactile signal.

Now dividing the signal into the signal section 73 and the signal section 77 (first signal sections), each having a sharp change in intensity and the steady signal section 74 (second signal section), the first signal section has more features to be preserved in terms of the nature of perception and the features are also more complicated. Accordingly, it is desirable to adopt a high-quality encoding method using a relatively high bit-rate, for example, waveform encoding such as Advanced Audio Codec (AAC) and lossless compression encoding such as Free Lossless Audio Codec (FLAC).

On the other hand, the latter steady second signal section has a gradual change over time. Accordingly, in the second signal section, there is little information loss even if long-time signals are collectively encoded, there are few features to be preserved, and the features are also simple. Therefore, it is expected that human beings are less likely to be aware of signal deterioration even if a method that emphasizes signal energy reproduction with high compression rate, such as Code Excited Linear Prediction (CELP) or Harmonic Vector Excitation Coding (HVXC); or a low-quality encoding method using a lower bit rate than the high-quality encoding method, such as parametric encoding that synthesizes equivalent signals from the above-mentioned features to be preserved, is used.

Therefore, in order to reproduce well the short time section such as the signal section 73 and the signal section 77, if the long time signal section 74 is also encoded by the high-quality encoding method, the tactile signal has an amount of redundant information as a whole, resulting in a reduced compression efficiency. An increase in the total amount of data due to such a reduced compression efficiency also causes a delay in transmission and reception of the tactile signal.

In addition, as a factor of delay, a factor other than the total amount of data as described above can be considered.

For example, when a tactile signal is transmitted through wireless communication, the encoded tactile data Dc for the tactile signal may be lost due to interference on the transmission path or the like. When data loss occurs, the data is retransmitted from the device on the transmitting side, and there may be a delay in the time required for the receiving side to complete the reception of the data. In other words, as the capacity of the data to be retransmitted increases, the time required for retransmitting the data corresponding to the data loss increases, and as a result, the time when the transmission and reception of the tactile signal is successfully completed may be further delayed.

As described above, if the time when the transmission of a tactile signal is completed is delayed, the reproducibility of the tactile sensation may be deteriorated. Specifically, a tactile stimulus is not given to the user (recipient) at an appropriate timing, so that a situation may occur in which the tactile stimulus fails to be synchronized with a content related to other sensations such as video and sound.

Next, the application of a specific type of wireless communication in consideration of the above-mentioned situation will be described.

Since the device for performing the tactile presentation is installed so as to be in touch with the user, it is generally desired to communicate wirelessly with other devices from the viewpoint of the weight of the device. However, when a wideband type of wireless connection such as Wi-Fi (registered trademark) is used, the battery of the device becomes large from the viewpoint of power consumption, so that the convenience of the user may be reduced. Further, when Wi-Fi is used, it generally takes a processing time for the procedures from a signal transmission request of the transmitting side device to the receiving processing of the receiving side device, so that there may be a larger delay as compared with other types of wireless connection.

On the other hand, a short-range type of wireless connection such as Bluetooth makes it possible to perform communication with low power consumption and low delay as compared with other types of wireless connection, so that it may be suitable for transmission of a tactile signal. However, in the short-range type of wireless connection, the allowable amount of data that can be transmitted at one time is less than that of other types of wireless connection. For example, in transmitting a content that gives a tactile stimulus to a user while synchronizing with video and sound, a situation may occur in which the communication capacity allocated to the transmission of a tactile signal is not sufficient.

In addition, in a service for streaming video and audio via the Internet, when an additional tactile sensation is to be transmitted to the user, for example, a situation may occur in which the communication capacity allocated to the transmission of a tactile signal is not sufficient due to the Quality of Service (QOS) function according to the line condition of the network.

In view of the above circumstances, the present embodiment aims to achieve both low delay of the tactile signal and suppression of deterioration of the tactile reproducibility by reducing the amount of data to be transmitted without impairing the tactile reproducibility as much as possible.

[6-2. Encoding Method]

Figure 8:
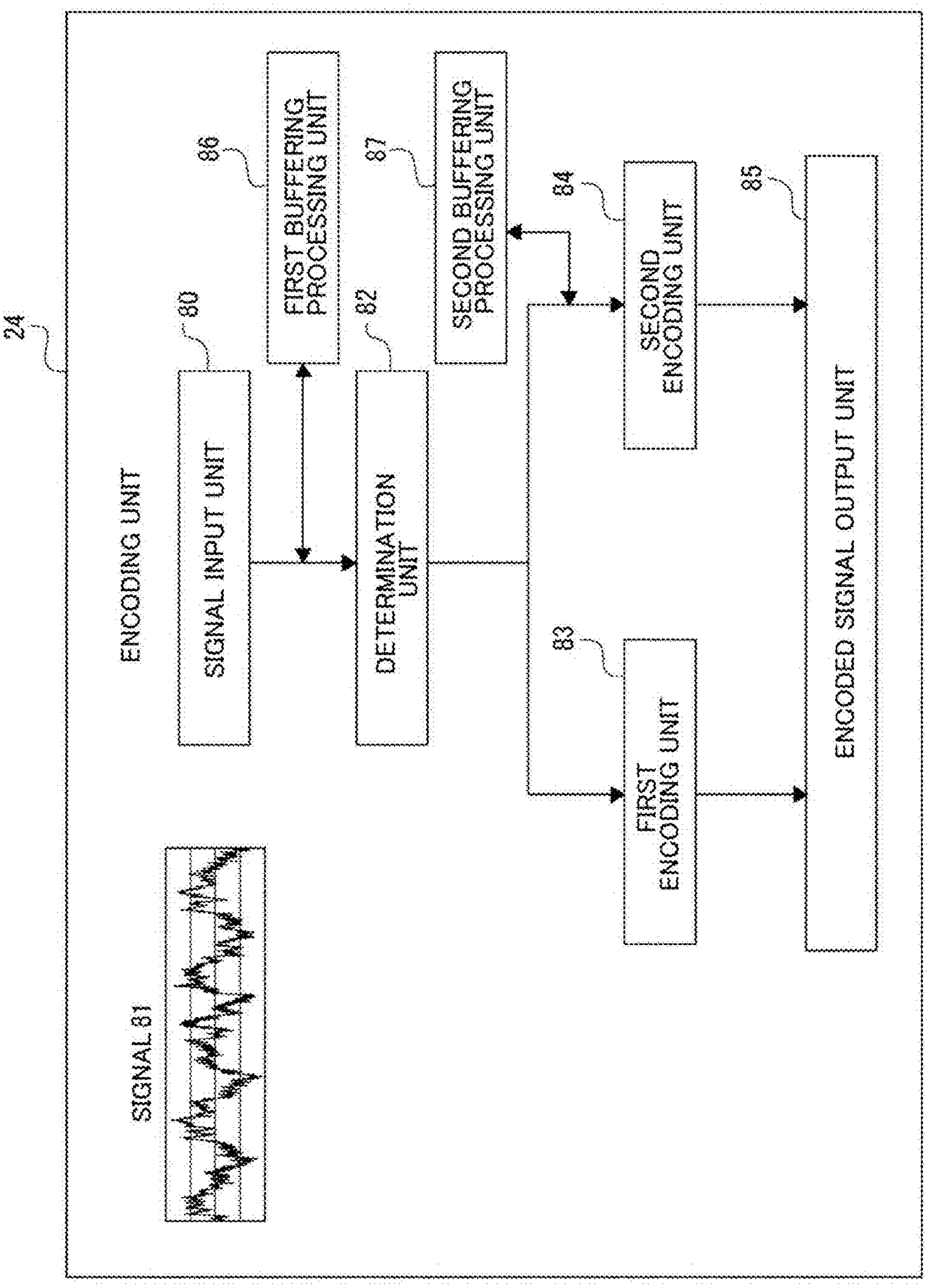
FIG. 8 is a diagram illustrating a configuration example of an encoding unit according to an embodiment.

FIG. 8 is a functional block diagram illustrating the functions of the encoding unit 24. As illustrated, the encoding unit 24 includes a signal input unit 80, a first buffering processing unit 86, a determination unit 82, a first encoding unit 83, a second buffering processing unit 87, a second encoding unit 84, and an encoded signal output unit 85.

A tactile signal 81 to be encoded is input to the signal input unit 80 from the preprocessing unit 23.

The first buffering processing unit 86 includes a first buffer memory used for determining a first signal section and a second signal section to buffer the tactile signal 81 input to the signal input unit 80.

As illustrated in FIG. 7, the determination unit 82 determines a first signal section (signal section 73, 77) which is a part of the touch signal section 200 in the tactile signal and includes the boundary between the touch state and the non-touch state of the object 79 and the hand 78, and a second signal section (signal section 74) which is a signal section except for the first signal section in the touch signal section 200, for example.

The determination unit 82 determines the first signal section based on, for example, the result of performing waveform analysis on the tactile signal 81. The determination unit 82 also determines that the signal section other than the first signal section is the second signal section.

A typical waveform analysis in determining the first signal section is signal rise detection based on an amplitude change rate of the tactile signal. The rising edge of this signal is carried out by a known signal processing method.

Here, the determination unit 82 can determine the first signal section by performing attack detection known in the fields of signal intensity change rate, frequency spectrum, and other signal processing.

The determination unit 82 can also determine the first signal section based on the distance between the object and the tactile sensor or the recognition of the occurrence of touch, which is detected by various other types of sensors. Further, the determination unit 82 may determine an encoding method using metadata (flagged encoding quality) given by the creator (operator).

Furthermore, as the determination unit 82, a determination device may be used that performs machine learning with a large number of vibration signals to automatically determine the target section from the input waveform.

The determination of the first signal section by the determination unit 82 can extend the advantageous effects of the present technology to general signals corresponding to the moment of touch of a person with the object 79 and the moment of release of the person from the object 79 in tactile sensation.

When it is determined that the whole or a part of the tactile signal 81 is the first signal section, the determination unit 82 transmits, to the first encoding unit 83, the corresponding section if it is a part or the whole tactile signal 81 if it is the whole.

The determination unit 82 also transmits the second signal section of the tactile signal 81 that is not transmitted to the first encoding unit 83 to the second buffering processing unit 87.

The first encoding unit 83 encodes the tactile signal in the first signal section received from the determination unit 82 by a high bit rate encoding method to generate first encoded data (encoded tactile data Dc). In the following description, the high bit rate encoding method is also referred to as a high-quality encoding method.

Here, the high-quality encoding method used for the first signal section is desirably a method using a relatively high rate that can restore complex waveform information, such as signal pulse height, width, and timing, and energy change rate, with high time resolution. For example, waveform encoding such as AAC and lossless compression encoding such as FLAC are applicable.

The second buffering processing unit 87 includes a second buffer memory to buffer the signal received according to the result of determining the signal section from the determination unit 82.

The second encoding unit 84 encodes the signal in the second signal section buffered by the second buffering processing unit 87 by an encoding method using a bit rate lower than that of the high-quality encoding method for the first signal section, to generate second encoded data (encoded tactile data Dc). In the following description, the encoding method using the bit rate lower than that of the high-quality encoding method is also referred to as a low-quality encoding method.

Here, in the low-quality encoding method used for the second signal section, it is desirable to encode a small number of parameters, such as energy and pitch, with a long time frame. Specifically, such encoding is a method that emphasizes signal energy and pitch reproduction with high compression rate, such as CELP and HVXC, or a parametric encoding method that synthesizes an equivalent signal from the above-mentioned features to be preserved.

Of such parameters, for example, an energy can be calculated by the following [Equation 2] using an effective value of a signal f[n].

[Math. 1]

$$E = \sqrt{\frac{\sum_{n=0}^{N-1} f[n]^2}{N}} \quad \text{[Equation 2]}$$

A typical method for acquiring a pitch is a method of obtaining a peak point m_0 of an autocorrelation function for signals as represented by the following [Equation 3] and using the reciprocal of the corresponding time as a pitch frequency.

[Math. 2]

$$R[m] = \sum_{n=0}^{N-1} f[n]f[n-m] \quad \text{[Equation 3]}$$

The encoded signal output unit 85 outputs the first encoded data generated by the first encoding unit 83 and the second encoded data generated by the second encoding unit 84.

Figure 9:
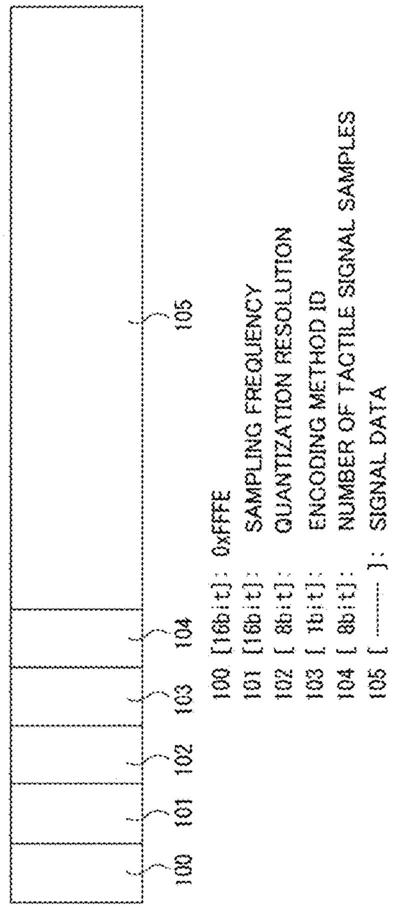
FIG. 9 is a diagram illustrating a configuration example of a data format of encoded tactile data according to an embodiment.

FIG. 9 illustrates a data format example of the encoded tactile data Dc. In FIG. 9, a data format for one frame of the encoded tactile data Dc is illustrated as an example.

An identifier 100 is stored at the beginning of a frame header added to the signal as associated information, the sampling frequency of the signal is recorded in a field 101, and the quantization resolution of the signal is recorded in a field 102. Further, in a field 103, an encoding method ID (Identification) for identifying whether the data has been encoded by a high-quality encoding method or a low-quality encoding method is stored. For example, "0" is stored for the high-quality encoding method, and "1" is stored for the low-quality encoding method. In a field 104, the number of signal samples included in this frame is stored, and in a field 105, signal data is stored.

Figure 10:
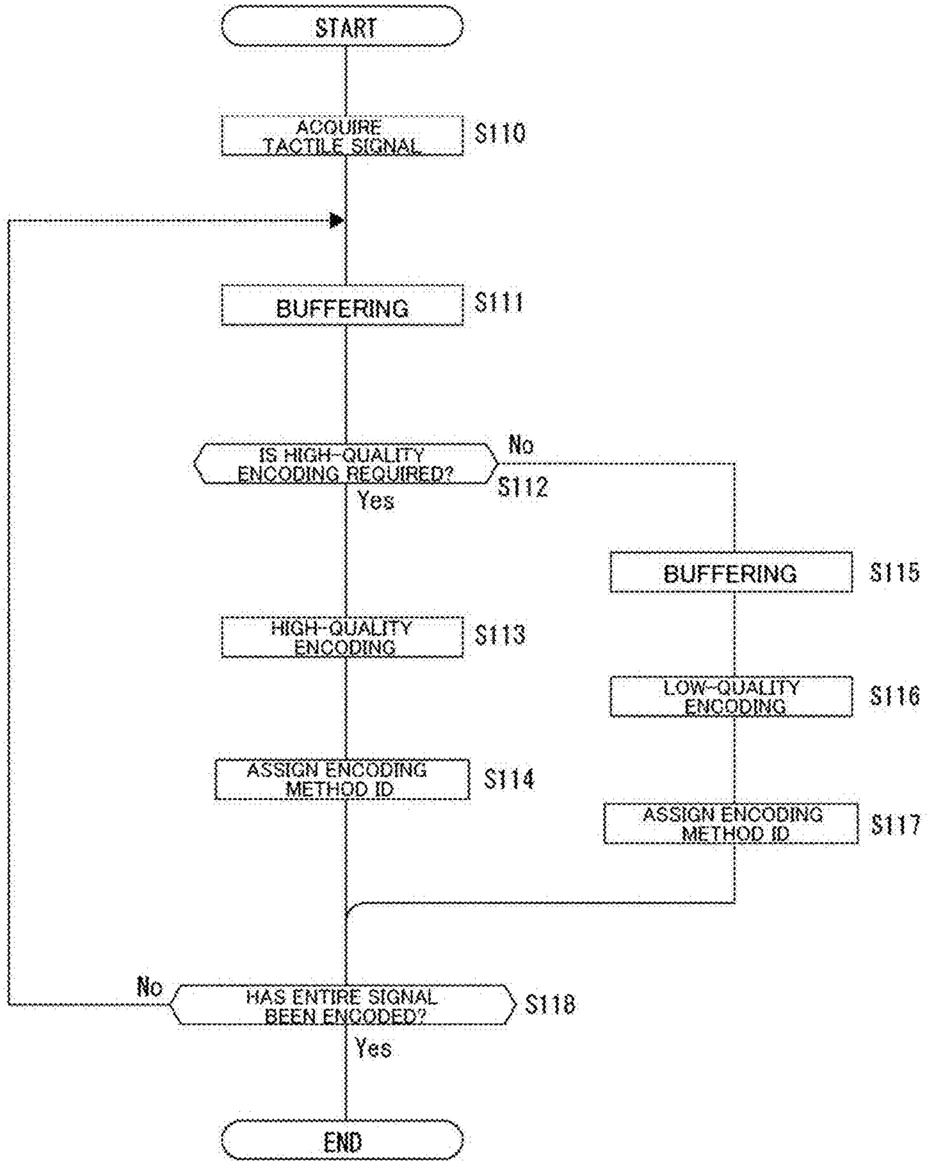
FIG. 10 is a flowchart illustrating processing to realize an encoding method according to an embodiment.

With reference to the flowchart of FIG. 10, an example of a processing procedure for implementing the encoding method as the embodiment described above will be described. The processing illustrated in FIG. 10 is processing of generating the encoded tactile data Dc for one frame, and is repeatedly executed for each frame.

The processing for implementing the encoding method in the encoding unit 24 may be implemented as software processing. Alternatively, it may be implemented by hardware or a combination of software and hardware.

First, the encoding unit 24 acquires a tactile signal to be encoded from the preprocessing unit 23 in step S110.

In step S111 following step S110, the encoding unit 24 buffers the acquired tactile signal in order to determine a first signal section and a second signal section. This is the processing corresponding to the above-mentioned first buffering processing unit 86.

In step S112 following step S111, the encoding unit 24 determines whether the signal section of the acquired tactile signal is a first signal section to be encoded using the high-quality encoding method or a second signal section to be encoded using the low-quality encoding method.

At this time, the encoding unit 24 determines, for example, based on a comparison between the amplitude change rate of the tactile signal and a predetermined threshold value, a rising edge of the signal as illustrated in the signal section 73 of FIG. 7 and a falling edge of the signal as illustrated in the signal section 77. The encoding unit 24 determines the signal section in which such a rising edge or falling edge of the signal is detected, as the first signal section. The encoding unit 24 also determines the signal section in which a rising edge or a falling edge of the signal is not detected, as the second signal section.

The encoding unit 24 may also determine a rising edge or a falling edge of the signal based on an intensity distribution in which the tactile signal is decomposed into its frequency components by using the frequency spectrum of the tactile signal.

The encoding unit 24 may also determine the first signal section and the second signal section based on section information on the first signal section and the second signal section added to the tactile signal 81. The section information is given as metadata by the work of a creator, for example, as described above.

An example of using metadata added to the tactile signal to determine the first signal section and the second signal section will now be described.

Figure 11:
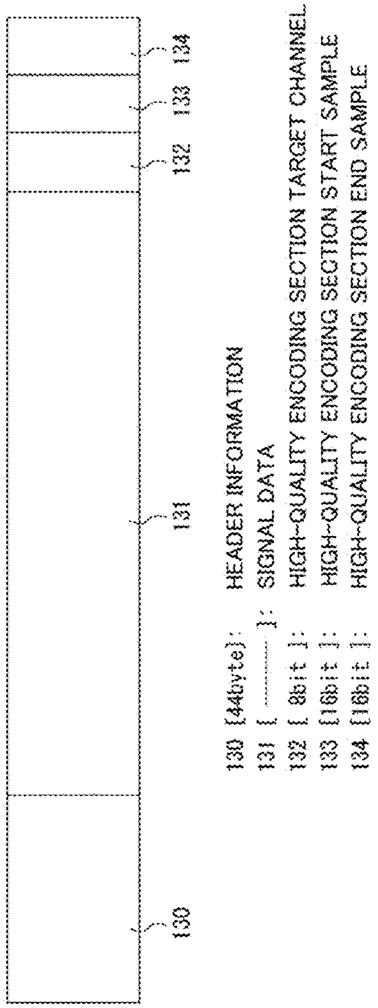
FIG. 11 is a diagram illustrating a configuration example of a data format of encoded tactile data according to an embodiment.

FIG. 11 illustrates a data format example of the encoded tactile data Dc. FIG. 11 illustrates a data format for one frame of a tactile signal input to the encoding unit 24. Here, a WAVE file is used as an example of the data format.

In the WAVE file, header information including format information such as sampling frequency, quantization resolution, and the number of channels is stored in a field 130 at the beginning, and signal data is stored in a field 131.

In the present embodiment, metadata for determining the first signal section to be encoded by the high-quality encoding method or the second signal section to be encoded by the low-quality encoding method is added to the end of this data. In the following description, the encoding by the high-quality encoding method is also referred to as high-quality encoding, and the encoding by the low-quality encoding method is also referred to as low-quality encoding.

Here, for a channel for a target to be subjected to the high-quality encoding, an example is illustrated in which the number of samples from the beginning of the file is assigned at each of the start point and the end point of the first signal section. A channel ID of the target to be subjected to the high-quality encoding is stored in a field 132, the number of start samples is stored in a field 133, and the number of end samples to be subjected to the high quality encoding is stored in a field 134. When there are a plurality of first signal sections to be subjected to the high-quality encoding, a set of fields 132, 133, and 134 may be added as many as the number of sections.

In that case, the encoding unit 24 checks in advance the end data (fields 132, 133, 134) of the signal input to be encoded in step S112 of FIG. 10, and determines whether or not the currently buffered signal section is the signal section specified by the metadata.

If the encoding unit 24 determines that it is the first signal section to be subjected to the high-quality encoding, the processing proceeds from step S112 to step S113 to perform the high-quality encoding on the first signal section. In other words, the encoding unit 24 performs encoding by an encoding method using a bit rate higher than in the low-quality encoding.

In step S114 following step S113, the encoding unit 24 generates first encoding data to which an encoding method ID corresponding to the high-quality encoding method is assigned.

Thereafter, the processing in the encoding unit 24 proceeds to step S118.

On the other hand, if the encoding unit 24 determines in step S112 that it is the second signal section other than the first signal section to be subjected to the high-quality encoding, the processing proceeds to step S115, and then the tactile signal is buffered until it enables the low-quality encoding.

In the present embodiment, the high-quality encoding uses a shorter conversion length, and the low-quality encoding uses a longer conversion length than in the high-quality encoding. Therefore, when it is determined that the high-quality encoding is unnecessary, the tactile signal may not be buffered enough to enable the low-quality encoding.

Accordingly, in step S115, the encoding unit 24 buffers the tactile signal for the number of samples required by the low-quality encoding. This is the processing corresponding to the above-mentioned second buffering processing unit 87.

In step S116 following step S115, the encoding unit 24 performs the low-quality encoding on the second signal section. Specifically, the encoding unit 24 performs encoding by an encoding method using a lower bit rate than in the high-quality encoding.

In step S117 following step S116, the encoding unit 24 generates second encoding data to which an encoding method ID corresponding to the encoding method for the low-quality encoding is assigned.

Thereafter, the processing in the encoding unit 24 proceeds to step S118.

In step S118, the encoding unit 24 determines whether or not the entire signal has been encoded, that is, whether or not the processing of generating the first encoded data and the second encoded data for all channels for the tactile signal has been completed.

When the processing for all signal sections is not completed, the processing in the encoding unit 24 returns to step S111. As a result, the same processing as for one frame is executed for the next section.

On the other hand, when the processing for all signal sections is completed, a series of processing illustrated in FIG. 11 ends in the encoding unit 24. When there are a plurality of channels, the encoding unit 24 executes the processing illustrated in FIG. 11 for all the channels.

In the present embodiment, an example in which the conversion length of the low-quality encoding method is longer than that of the high-quality encoding method has been described. However, the present technology can also be applied to the case where the conversion lengths of the low-quality encoding method and the high-quality encoding method are equal.

Figure 12:
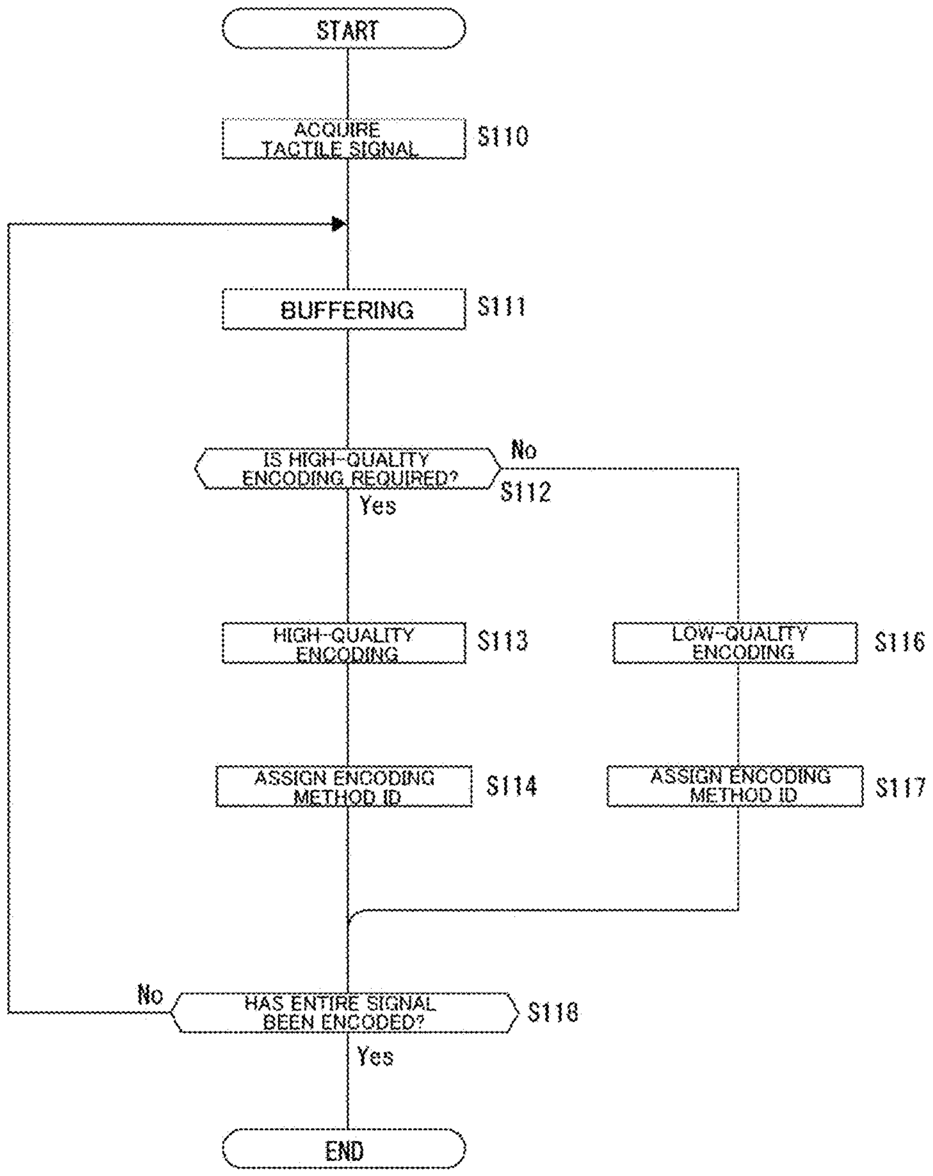
FIG. 12 is a flowchart illustrating processing to realize an encoding method according to an embodiment.

In this case, the encoding unit 24 always buffers a number of samples equal to the conversion length in step S111, and applies only one type of encoding quality to each signal buffered at one time. As a result, the buffering performed in step S115 prior to encoding by the low-quality encoding in step S116 is not necessary as illustrated in FIG. 12. By making the conversion lengths of the low-quality encoding and the high quality encoding equal in this way, the processing load of the encoding unit 24 is reduced.

[6-3. Decoding Method]

The functions of the combining unit 33 and the decoding unit 34 in the decoding device 3 will be described with reference to FIG. 4.

The decoding unit 34 includes a first decoding unit 34*a* and a second decoding unit 34*b*.

The first decoding unit 34*a* decodes the first encoded data obtained by performing the high-quality encoding on the first signal section which is a part of the touch signal section. The first decoding unit 34*a* transmits first waveform data obtained by decoding the first encoded data to the combining unit 33.

The second decoding unit 34*b* decodes the second encoded data obtained by performing the low-quality encoding on the second signal section which is a signal section except for the first signal section. The second decoding unit 34*b* transmits second waveform data obtained by decoding the second encoded data to the combining unit 33.

The combining unit 33 combines the first waveform data obtained by decoding the first encoded data and the second waveform data obtained by decoding the second encoded data.

The combining unit 33 determines whether the waveform data currently being output is that has been encoded by an encoding method different from that for the currently decoded waveform data waiting to be output.

If their encoding methods are the same, the combining unit 33 appropriately post-processes and outputs the signal according to the encoding method. Specifically, in this post-processing, the waveform data waiting to be output and the waveform data being output are subjected to combining processing to be normally performed in the encoding method, while combining processing including cross-fade described later is not performed.

On the other hand, if their encoding methods are different, the number of signal samples and the handling of termination may be different between the encoding methods, and if the signal is output as it is, an unpleasant discontinuous waveform may occur. Therefore, when decoded data following the waveform data encoded by a different encoding method is output, the combining unit 33 performs signal processing so that the two data are smoothly combined.

Figure 13:
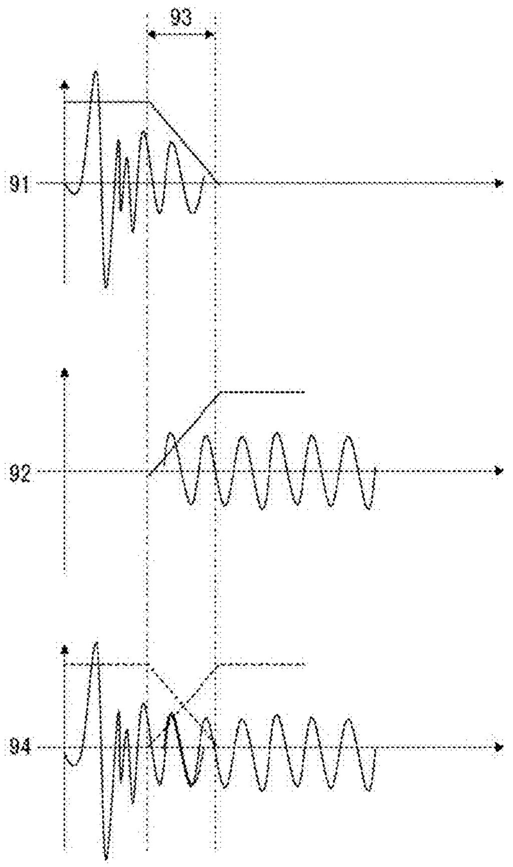
FIG. 13 is an illustrative diagram of cross-fade processing performed by a combining unit according to an embodiment.

The combining unit 33 performs cross fade processing on a combined portion between the first waveform data and the second waveform data which have originally been encoded by different encoding methods, for example. As illustrated in FIG. 13, when first waveform data 91 which has originally been subjected to the high-quality encoding and second waveform data 92 which has originally been subjected to the low-quality encoding are continuously output, a section 93 where the first waveform data 91 and the second waveform data 92 overlap is defined, and data pieces in that section are each multiplied and added up with a coefficient such that the total of the data pieces becomes "1", so that it is possible to smoothly combine the first waveform data 91 and the second waveform data 92 to obtain an output waveform 94. The same applies to the case where the second waveform data 92 which has originally been subjected to the low-quality encoding and the first waveform data 91 which has originally been subjected to the high-quality encoding are continuously output.

The combining unit 33 may use known processing other than the cross-fade processing for the processing of combining the first encoded data and the second waveform data.

Figure 14:
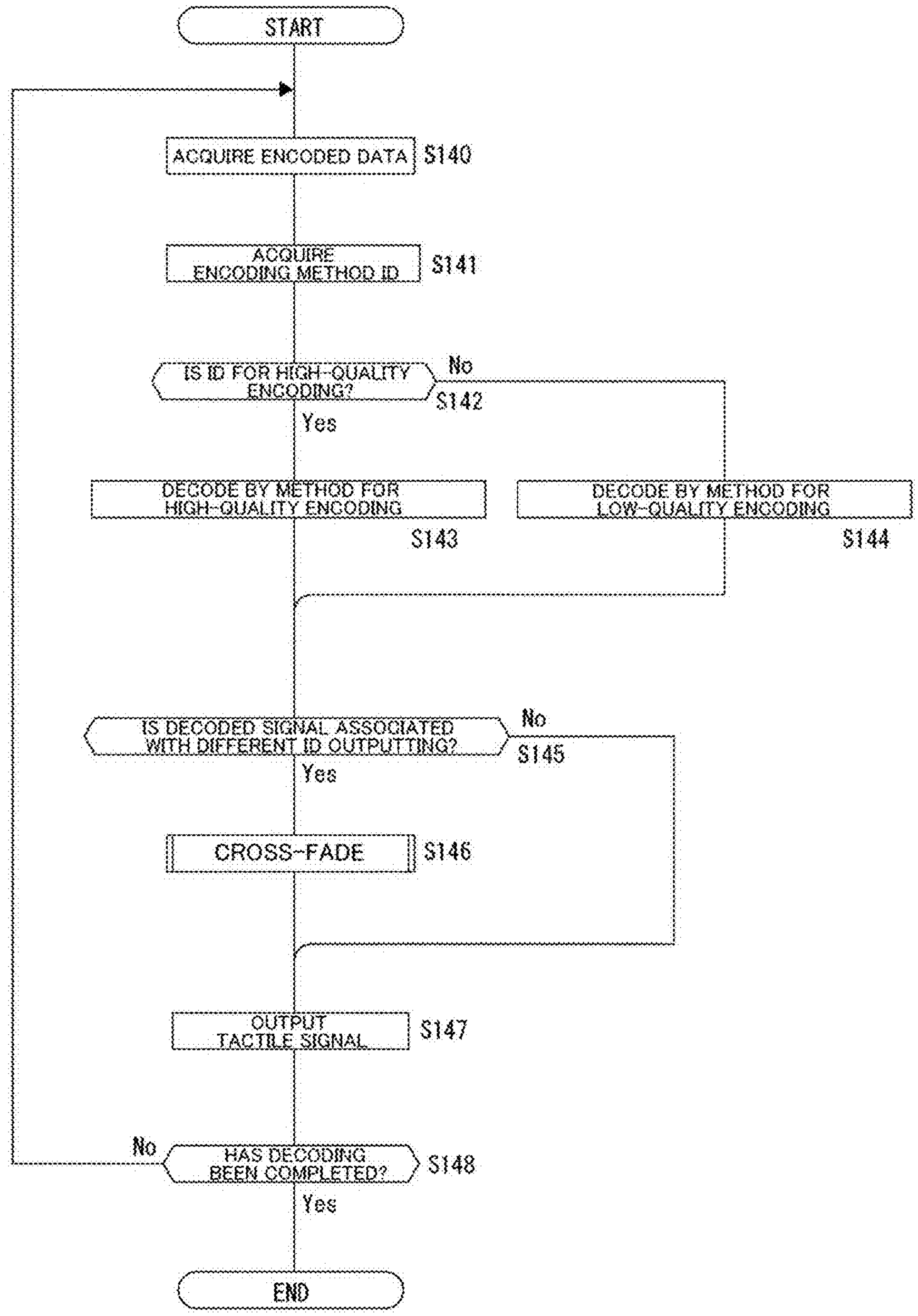
FIG. 14 is a flowchart illustrating processing to realize a decoding method according to an embodiment.

With reference to the flowchart of FIG. 14, an example of a processing procedure for implementing the decoding method as the embodiment described above will be described. The processing illustrated in FIG. 14 is processing of decoding the encoded tactile data Dc for one frame to obtain a tactile signal, and is repeatedly executed for each frame.

The processing for implementing the encoding method in the decoding device 3 may be implemented as software processing. Alternatively, it may be implemented by hardware or a combination of software and hardware.

First, the decoding unit 34 of the decoding device 3 acquires the encoded tactile data Dc in step S140. In step S141 following step S140, the decoding unit 34 acquires the encoding method ID from the encoded tactile data Dc.

In step S142 following step S141, the decoding unit 34 determines based on the acquired encoding method ID whether the encoded tactile data Dc is the first encoded data encoded by the high quality encoding method or the second encoded data encoded by the low-quality encoding method.

If the encoding method ID indicates encoding by the high-quality encoding method, the processing in the decoding unit 34 proceeds from step S142 to step S143 to decode the first encoded data by a decoding method corresponding to the high-quality encoding method. The decoding unit 34 transmits first waveform data obtained by decoding the first encoded data to the combining unit 33. Thereafter, the processing in the decoding unit 34 proceeds from step S143 to step S145.

On the other hand, if the encoding method ID indicates encoding by the low-quality encoding method, the processing in the decoding unit 34 proceeds from step S142 to step S144 to decode the second encoded data by a decoding method corresponding to the low-quality encoding method. The decoding unit 34 transmits second waveform data obtained by decoding the second encoded data to the combining unit 33.

Thereafter, the processing in the decoding unit 34 proceeds from step S144 to step S145.

In step S145, the combining unit 33 of the decoding device 3 determines whether or not the encoding method for the waveform data currently waiting to be output decoded by the decoding unit 34 and the encoding method for the waveform data currently being output are different from each other.

If the encoding methods are different, the processing in the combining unit 33 proceeds from step S145 to step S146 to perform the cross-fade processing as illustrated in FIG. 9 on the combined portion between the two pieces of waveform data.

Details of the cross-fade processing executed by the combining unit 33 will now be described with reference to FIGS. 15 and 16.

Figure 15:
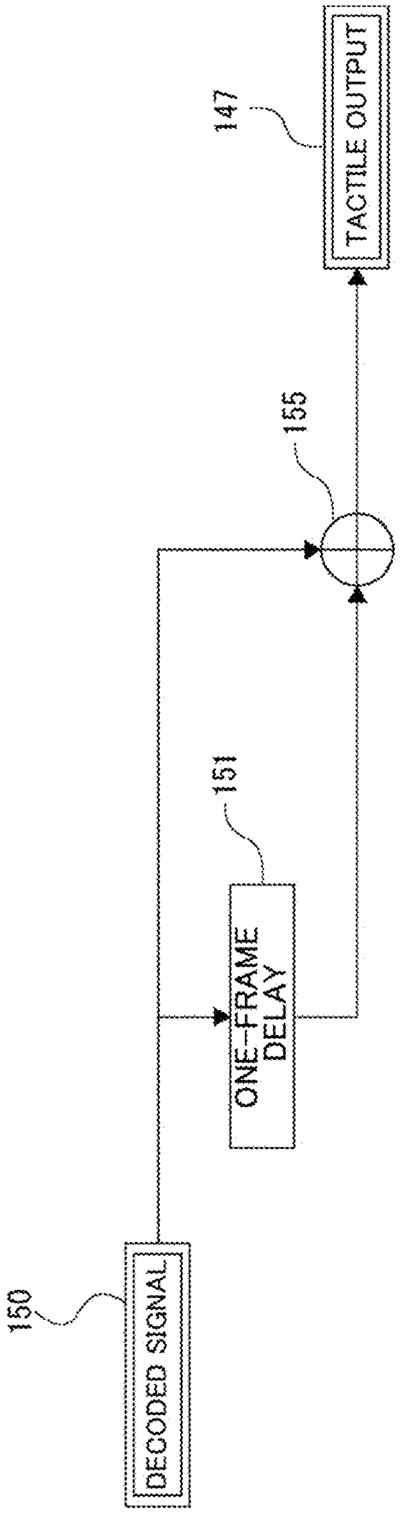
FIG. 15 is a detailed diagram of cross fade processing performed by a combining unit according to an embodiment.

As illustrated in FIG. 15, the combining unit 33 passes a decoded signal 150 decoded in step S143 or step S144 of FIG. 14 through a block 151 that delays the decoded signal 150 by one frame by buffering or the like.

Then, the combining unit 33 compares the delayed signal (waveform data waiting to be output) passing through the block 151 with the latest decoded signal 150 (waveform data currently being output).

If the encoding methods for the delayed signal and the decoded signal 150 are the same, the combining unit 33 combines the latest decoded signal 150 with the delayed signal by normal combining processing as illustrated in FIG. 15 to generate a tactile output 147. An addition unit 155 in the figure represents that the decoded signal 150 is combined to the delayed signal in such a way.

Figure 16:
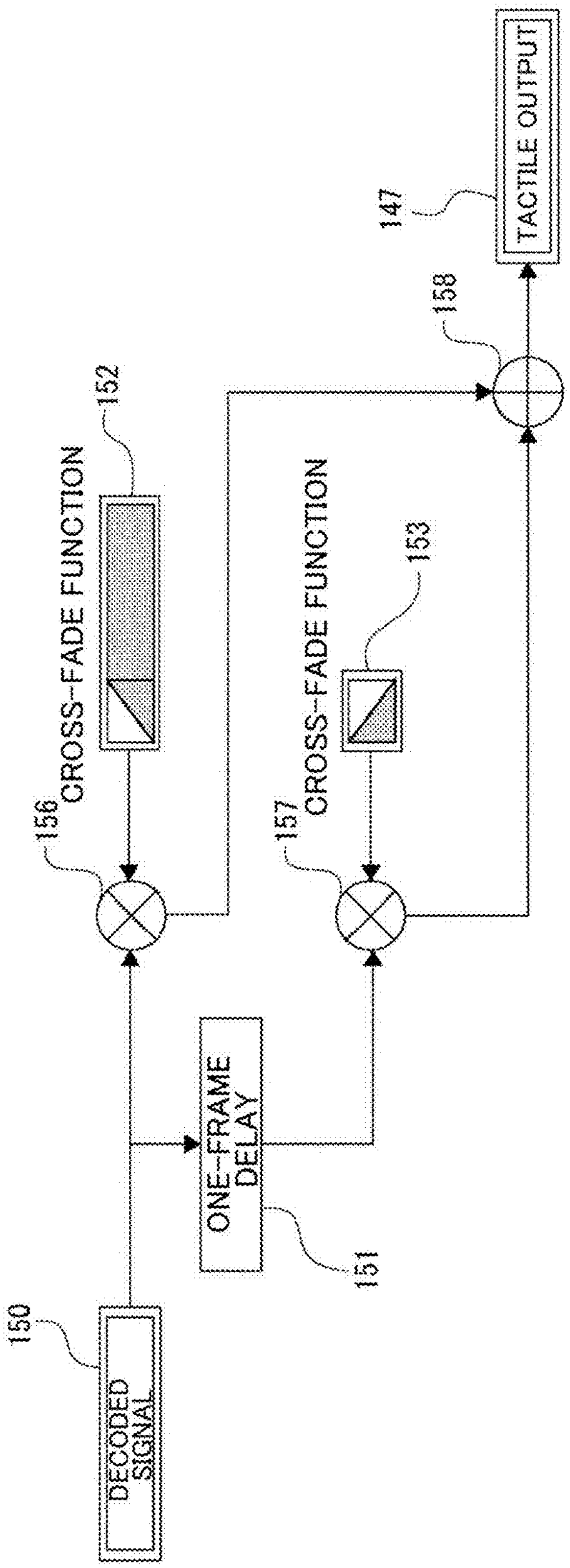
FIG. 16 is a detailed diagram of cross-fade processing performed by the combining unit according to the embodiment.

If the encoding methods for the delayed signal and the decoded signal 150 are different, the combining unit 33 performs cross fade processing illustrated in FIG. 16. The delayed signal and the decoded signal 150 each have a margin, which is a portion where their frames overlap. This margin portion referred to as a combining margin portion.

The cross fade processing uses a cross-fade function 152 multiplied by the decoded signal 150 and a cross-fade function 153 multiplied by the delayed signal. For the fade-in and fade-out portions of the cross-fade functions 152 and 153, any window function having a total of “1” can be used such as a triangular window and a Hanning window. The cross-fade function 152 is a function that transitions from “0” to “1” in the combining margin portion with the passage of time and maintains “1” after the combining margin portion. The cross-fade function 153 is a function that transitions from “1” to “0” in the combining margin portion with the passage of time.

The combining unit 33 multiplies the decoded signal 150 by the cross-fade function 152 by a multiplication unit 156, and multiplies the delayed signal by the cross-fade function 153 by a multiplication unit 157. The combining unit 33 generates a tactile output 147 by adding the multiplication results by an addition unit 158.

After the cross-fade processing in step S146 of FIG. 14, the processing in the combining unit 33 proceeds to step S147.

When the encoding methods are not different, that is, the encoding method for the currently received waveform data and the encoding method for the next received waveform data are the same, the processing in the combining unit 33 proceeds to step S147 without performing the cross-fade processing in step S146. This is because, in general, any encoding method is originally designed so that signals are smoothly combined even at the joint of the units to be converted, and it is not necessary to perform additional processing for combining the signals.

The combining unit 33 outputs the decoded tactile signal in step S147. In step S148 following step S147, the decoding unit 34 determines whether or not all the encoded tactile data Dc have been decoded, that is, whether or not the decoding processing has been completed for the encoded tactile data Dc for all signal sections of the tactile signal.

When the processing for all signal sections is not completed, the processing in the decoding unit 34 returns to step S140. As a result, the same processing as for one frame is executed for the remaining section(s).

On the other hand, when the processing for all signal sections is completed, a series of processing illustrated in FIG. 14 ends in the decoding unit 34. When there are a plurality of channels, the decoding unit 34 executes the processing illustrated in FIG. 14 for all the channels.

7. First Application Example

Figure 17:
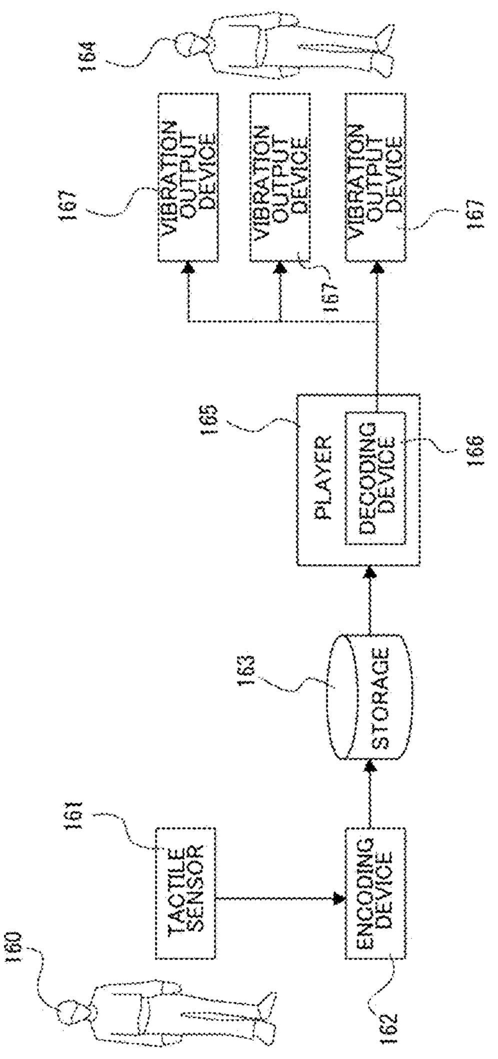
FIG. 17 is a diagram illustrating a configuration example of a first application example of an embodiment.

As a first application example of the present technology, consider a tactile movie in which vibration as a tactile sensation is presented to a viewer, in addition to the video and audio as illustrated in FIG. 17.

First, at the stage of creation, vibration is collected in addition to video and audio. In this collection, for example, the vibration perceived by a character in the movie is recorded, for example, by using a tactile sensor 161 (tactile sensor 5) mounted on the body of an actor 160. In another example, vibrations generated in the environment are recorded by an installation on the floor of the collecting site.

The vibration waveform collected (recorded) in this way is encoded by an encoding device 162 (encoding device 2). The details of the encoding are as described with reference to FIGS. 8, 10 and 12, and after the control of the encoding quality involving the analysis of the signal and the use of meta information, the section(s) with a sharp change in signal strength is/are encoded by the high-quality encoding method and the other section(s) is/are encoded by the low-quality encoding method. After the video and audio are also encoded by a known method, the encoded video/audio/vibration data is stored in a storage 163 typified by a DVD (Digital Versatile Disc) or the like.

For example, in the case where a character traces a wall with the hand, it is desirable for the moment of touch to adopt the high-quality encoding because the vibration waveform has a large change over time; it is sufficient for the period during which the character moves the hand along the wall to adopt the low-quality encoding.

Therefore, when a tactile signal is input by the tactile sensor 161 mounted on the hand of the actor 160, a known signal processing method is applied to the tactile signal to detect the rising edge of the signal, and the high-quality encoding is performed only on that section (first signal section). Further, at the moment when a creator wishes to give a sensation of touch with a wall while viewing captured images, the creator may add such meta information to the tactile signal. In this case, the determination unit 82 of FIG. 8 detects this meta information, and performs the high-quality encoding only on the tactile signal at that time. As a result, the encoded tactile data Dc can be obtained in which the high-quality encoding is performed only at the moment of touch with the wall and the low-quality encoding is performed in other times.

As another example, vibrations generated by a touch with a wall may not be collected during shooting of a movie, and instead, a creator may design a waveform for giving a sensation as if a touch with the wall occurs. Even for this case, the encoding method can be determined by a signal processing method and meta information additionally given by the creator as described above.

A viewer 164 watches a movie from the storage 163 by a player 165. Meanwhile, the player 165 decodes and outputs the video and audio from a known video and audio output device by a known method.

The corresponding vibration signal(s) is/are also decoded by a decoding device 166 (decoding device 3) by the method described with reference to FIG. 14, and then output from a vibration output device(s) 167. In other words, the signals are decoded for the respective sections according to the corresponding encoding method ID assigned at the time of encoding, the signal switching processing is performed so as to obtain a smooth signal as necessary, and the resulting signal is output as a decoded signal.

At this time, a plurality of vibration signal systems may be output corresponding to the number of systems stored in the storage, or a number of vibration signal systems may be output adjusted according to the number of devices owned by the viewer 164. A known channel number conversion method can be used for this adjustment.

In the present embodiment, it is possible to save the storage required for storing the vibration data. As a result, the advantageous effects of a reduced storage cost, a further increased number of channels of vibration, an increased resolution, and an increased storage used for video and audio can be obtained.

8. Second Application Example

Figure 18:
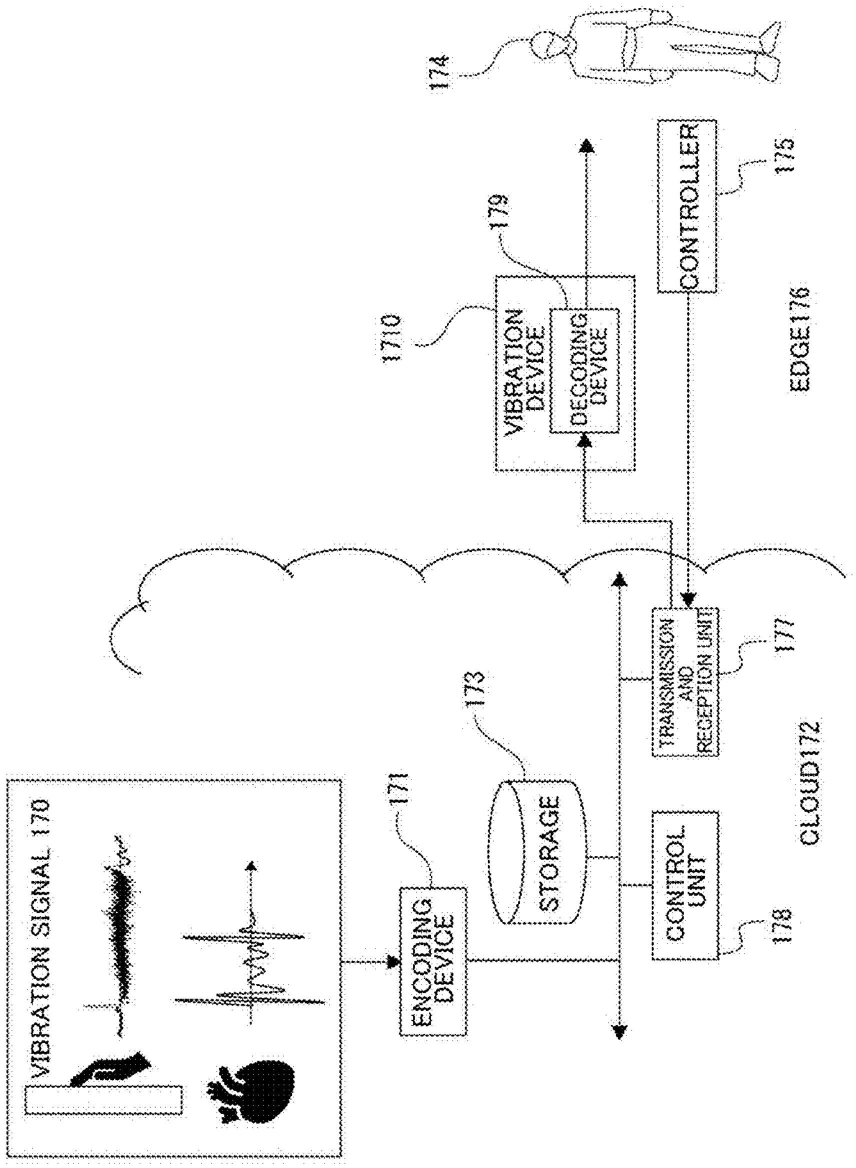
FIG. 18 is a diagram illustrating a configuration example of a second application example of an embodiment.

As a second application example of the present technology, consider a cloud game in which all operations of a user 174 as illustrated in FIG. 18 are transmitted from an edge 176 to a cloud 172, all the changes in video, audio, and tactile sensation in response to the operations are calculated and processed on the cloud 172, and the results are transmitted to the edge 176 (returning to the user 174) and reproduced there.

A general home video game, that is, an example in which a console is placed in front of the user 174, button operations of the user 174 are transmitted to the console, and various signals processed there are transmitted to various output devices through wired connection or through very short-range wireless connection, has the same problem, configuration, and effects as the tactile movie described in the first application example, and thus, the description thereof will be omitted.

Since there is no high-performance computer on the edge 176 in cloud games, the interpretation of complicated user operations and the synthesis and adjustment of feedback based on the interpretation are all performed on the cloud 172, and the resulting large capacity data such as video, audio, and tactile sensation is transmitted from the cloud 172 to the edge 176.

At this time, if the communication band from the cloud 172 to the edge 176 is not sufficiently secured, noise and signal interruption occur on the edge 176 side, which greatly impairs the user experience. In addition, the vibration in tactile sensation is different depending on how the same object is touched, and accordingly, a method of storing such different vibrations as separate signals requires a huge amount of storage. Although a method of storing only the reference signal and modulating that signal according to how the object is touched may be used, the former method is expected to obtain a higher quality of output signal.

The second application example will be described. It is now assumed that video and audio are handled by a known method, and only the tactile sensation will be described in this application example. First, at the stage of creating a game, a recorded or synthesized vibration signal 170 (tactile signal) is prepared. Examples of such vibration include the vibration of shooting with a gun, the vibration of opening a door, the vibration of tracing a wall, the vibration of being hit on the shoulder, and so on. It may also be a vibration that is difficult to perceive, such as heartbeat. Each of these signals is encoded by the encoding device 171 (encoding device 2).

In this encoding, as described above, quality control and the corresponding encoding method for each section are applied. The encoded tactile data Dc thus obtained is stored in a storage 173 on the cloud 172.

Next, when the user 174 plays this game, an operation of the user 174 is first input from a controller 175 and transmitted from the edge 176 to the cloud 172. On the cloud 172, the operation of the user 174 is received by a transmission and reception unit 177, and interpreted by a control unit 178 to select and read out the encoded tactile data Dc of the vibration signal to be output from the storage 173.

The read encoded tactile data Dc is transmitted to the edge 176 as it is, decoded by a decoding device 179 (decoding device 3) at the edge 176, and output from a vibration output device 1710.

As a result, the amount of information of the encoded tactile data Dc to be recorded is reduced, so that it is possible to reduce the storage capacity on the cloud 172. In addition, communicating the data as encoded and then decoded on the edge 176 side makes it possible to reduce the amount of communication data, so that the user 174 can enjoy experience of a realistic tactile sensation with vibration signals in a cloud game, even with a narrow communication band between the cloud 172 and the edge 176.

This application example is simple because the decoding processing includes only reading an encoding method ID and the corresponding decoding, and there is also an advantage that a high-performance computer is not required on the edge 176 side.

As a modification example of the second application example, the encoding quality may be adjusted according to the communication band. Before the encoded tactile data Dc read from the storage 173 is transmitted as it is from the transmission and reception unit 177, the control unit 178 acquires the communication band information between the cloud 172 and the edge 176.

If the current communication environment is excellent, the encoded tactile data Dc is transmitted as it is from the transmission and reception unit 177. On the other hand, if the communication environment is poor, the read encoded tactile data Dc is encoded again by the encoding device 171. At this time, the control unit 178 provides new encoded tactile data Dc suitable for the communication environment.

For example, if it is determined that the communication environment is poor when the encoded tactile data Dc of a vibration signal corresponding to tracing a wall is transmitted, for example, a method in which a longer time frame is used to encode the second signal section on which the low-quality encoding is performed while the hand is moved along the wall and thus to reduce the frequency of parameter updates makes it possible to further reduce the amount of data at the expense of some quality.

In the second application example of the present technology, the separation between the first signal section to be subjected to the high-quality encoding and the second signal section to be subjected to the low-quality encoding is based on human perceptual characteristics, and accordingly, such adjustment is easily performed while maintaining human perception. For example, since the above adjustment is for the section where the time resolution is originally considered not to be a key factor, the influence due to even the adjustment of the frequency of parameter updates is restrictive.

9. Third Application Example

Figure 19:
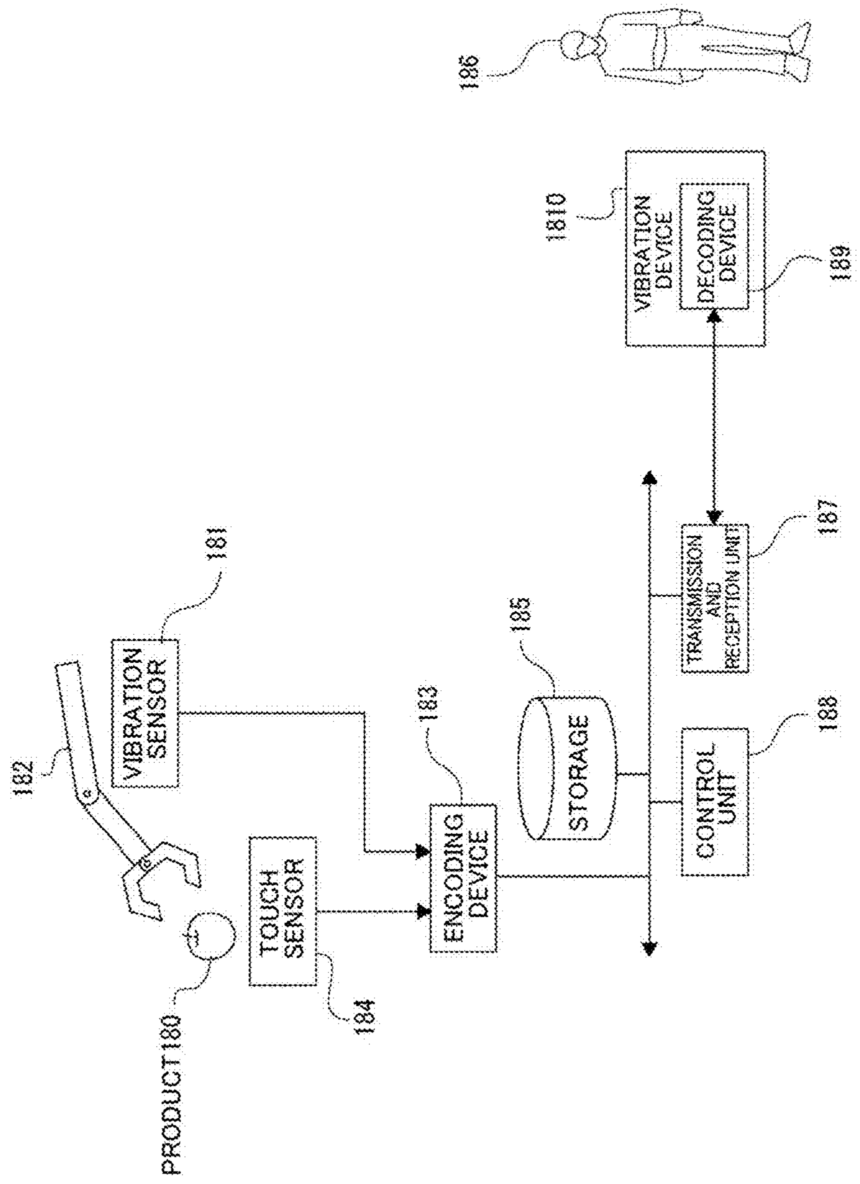
FIG. 19 is a diagram illustrating a configuration example of a third application example of an embodiment.

As a third application example of the present technology, consider an example in which, in mail-order sales via the Internet as illustrated in FIG. 19, the texture of a product 180 is reproduced as a vibration to make a user 186 feel tactile information on the product 180. For example, when the user 186 finds a product on a shopping site, a vibration device 1810 at hand can output a vibration as its detailed information, so that the user 186 can confirm the vibration as the texture of the product 180.

First, in order to record the texture of the product 180, a vibration sensor 181 (tactile sensor 5) is used to record the vibrations when various touches are made. At this time, for example, a robot arm 182 may be used for repeated touch motions.

Each piece of vibration signal data acquired by the vibration sensor 181 is encoded by an encoding device 183 depending on the corresponding touch motion. This encoding method is as described above, and in this application example, a touch sensor 184 (tactile sensor 5) is additionally attached to the robot arm 182, and the quality of encoding is controlled based on the information from the touch sensor 184.

For example, the moment when the robot arm 182 touches the product 180 and the moment when the robot arm 182 leaves the product 180 can be identified by the touch sensor 184.

It is predicted that the change in the signal over time is sharp for a certain period from that moment. Accordingly, that section is set as the first signal section to be subjected to the high-precision encoding. In this case, since the quality control is completed by the information from the touch sensor 184, signal processing is unnecessary. Then, the resulting pieces of encoded tactile data Dc are stored in a storage 185.

Next, a transmission and reception unit 187 receives a reproduction request from the user 186, and a control unit 188 reads out the appropriate encoded tactile data Dc from the storage 185 and transmits it to the user 186 side. A decoding device 189 (decoding device 3) on the receiving user 186 side decodes the encoded tactile data Dc, and reproduces the vibration from a vibration device 1810 held by the user 186.

As a result, the user 186 can feel the texture of the product 180 over the Internet. In addition, due to the advantageous effects of this application example, the data capacity is reduced, so that the vibration data can be downloaded in a short time, and the load on the web page is also reduced, so that the quality of the user experience is not impaired.

10. Summary

The decoding device 3 according to the above-described embodiment includes: the first decoding unit 34*a* that decodes first encoded data obtained by encoding (high-quality encoding) a first signal section (for example, the signal section 73 or 77) with a first bit rate, the first signal section being a part of the touch signal section 200 which is a signal section indicating a touch state with an object in a tactile signal, the first signal section being a signal section including a boundary between the touch state and a non-touch state with the object; and the second decoding unit 34*b* that decodes second encoded data obtained by encoding (low-quality encoding) a second signal section (for example, the signal section 74) with a bit rate lower than the first bit rate, the second signal section being a signal section except for the first signal section in the touch signal section 200 (see S140 to S144 in FIGS. 4, 7, and 14).

The encoded tactile data Dc in which only the significant section in the touch signal section is encoded (high-quality encoded) with the high bit rate and the other section is encoded (low-quality encoded) with the low bit rate is decoded, so that both a reduced amount of data to be transmitted and a guarantee of reproduction of tactile sensation can be achieved.

Thus, it is possible to receive the data, in which the amount of the entire encoded tactile data Dc to be transmitted is reduced, with low delay without impairing the tactile reproducibility as much as possible. Therefore, it is possible for the recipient to experience a high-quality tactile sensation without feeling a delay.

The decoding device 3 according to the embodiment includes the combining unit 33 that combines first waveform data obtained by decoding the first encoded data and second waveform data obtained by decoding the second encoded data (see S145 and S146 in FIGS. 4 and 14).

As a result, the pieces of waveform data are integrated into one piece of waveform data.

Therefore, it is possible to prevent the generation of an unpleasant discontinuous waveform caused by outputting pieces of waveform data separately, so that the tactile reproducibility can be improved.

In the decoding device 3 according to the embodiment, the combining unit 33 performs cross-fade processing on a combined portion between the first waveform data and the second waveform data (see S146 in FIG. 14, and FIGS. 15 and 16). As a result, the first waveform data and the second waveform data are smoothly combined.

Therefore, it is possible to prevent the generation of an unpleasant discontinuous waveform caused by outputting pieces of waveform data separately, so that the tactile reproducibility can be improved.

The decoding method according to the embodiment includes: decoding first encoded data obtained by encoding (high-quality encoding) a first signal section with a first bit rate, the first signal section being a part of a touch signal section (for example, the signal section 73 or 77) which is a signal section indicating a touch state with an object in a tactile signal, the first signal section being a signal section including a boundary between the touch state and a non-touch state with the object; and decoding second encoded data obtained by encoding (low-quality encoding) a second signal section (for example, the signal section 74) with a bit rate lower than the first bit rate, the second signal section being a signal section except for the first signal section in the touch signal section.

Also according to such a decoding method as an embodiment, the same operation and effect as those of the decoding device 3 as the above-described embodiment can also be obtained.

The encoding device 2 according to the embodiment includes: the determination unit 82 that determines a first signal section (for example, the signal section 73 or 77) and a second signal section (for example, the signal section 74), the first signal section being a part of a touch signal section 200 which is a signal section indicating a touch state with an object in a tactile signal, the first signal section being a signal section including a boundary between the touch state and a non-touch state with the object, the second signal section being a signal section except for the first signal section in the touch signal section 200; the first encoding unit 83 that encodes (high-quality encodes) the first signal section with a first bit rate; and the second encoding unit 84 that encodes (low-quality encodes) the second signal section with a bit rate lower than the first bit rate (see FIGS. 7, 8, and 10). Only the significant section in the touch signal section is encoded with the high bit rate, and the other section is encoded with the low bit rate, so that both a reduced amount of data to be transmitted and a guarantee of reproduction of tactile sensation can be achieved.

Thus, it is possible to reduce the amount of the entire encoded tactile data Dc to be transmitted without impairing the tactile reproducibility as much as possible. Therefore, it is possible to transmit the encoded tactile data Dc with low delay while maintaining the perceptual quality of the tactile signal.

In the encoding device 2 according to the embodiment, the determination unit 82 determines the first signal section and the second signal section based on section information on the first signal section and the second signal section added to the tactile signal (see S112 in FIG. 10, and FIG. 11).

As a result, processing such as waveform analysis is not necessary in determining the first signal section and the second signal section.

Therefore, the processing load of the encoding device 2 for determining the first signal section and the second signal section can be reduced, so that it is possible to perform more efficient encoding processing.

In the encoding device 2 according to the embodiment, the determination unit 82 determines the first signal section and the second signal section based on a result of performing a waveform analysis on the tactile signal (see S112 in FIG. 10). As a result, information for differentiating between the first signal section and the second signal section is not required to be added to the touch signal in individually encoding the first signal section and the second signal section. Therefore, it is possible to reduce the burden on the operator who creates the touch signal to which section information is added for each signal section.

In the encoding device 2 according to the embodiment, the determination unit 82 determines the first signal section and the second signal section based on an amplitude change rate of the tactile signal (see S112 in FIG. 10).

As a result, it is possible to appropriately determine the first signal section with a sharp change in the waveform of the tactile signal.

Therefore, it is possible to appropriately achieve both a reduced amount of data and a guarantee of reproduction of tactile sensation.

In the encoding device 2 according to the embodiment, the second encoding unit 84 encodes the second signal section by an encoding method using a longer conversion length than in encoding for the first signal section (see S116 in FIG. 10).

As a result, the amount of second encoded data in the second signal section is reduced.

Therefore, it is possible to reduce the amount of the entire encoded tactile data Dc to be transmitted.

In the encoding device 2 according to the embodiment, the second encoding unit 84 performs parametric encoding on the second signal section (see S116 in FIG. 10).

As a result, the amount of second encoded data in the second signal section is reduced.

Therefore, it is possible to reduce the amount of the entire encoded tactile data Dc to be transmitted.

The encoding device 2 according to the embodiment includes a first buffer memory used for determining the first signal section and the second signal section, and a second buffer memory used for encoding the second signal section according to a result of determining (see S111 and S115 in FIGS. 8 and 10). As a result, it is possible for the second buffering processing unit 87 to buffer a tactile signal that fails to be buffered by the first buffering processing unit 86 for the tactile signal in the second signal section for which the conversion length is longer than in the encoding for the first signal section.

Therefore, it is not necessary to match the buffering period with the second signal section having a long conversion length, so that it is possible to prevent the processing time of the high-quality encoding for the tactile signal of the first signal section from being delayed and thus to improve the efficiency of the encoding processing.

The encoding method according to the embodiment includes: determining a first signal section (for example, the signal section 73 or 77) and a second signal section (for example, the signal section 74), the first signal section being a part of a touch signal section 200 which is a signal section indicating a touch state with an object in a tactile signal, the first signal section being a signal section including a boundary between the touch state and a non-touch state with the object, the second signal section being a signal section except for the first signal section in the touch signal section 200; encoding (high-quality encoding) the first signal section with a first bit rate; and encoding (low-quality encoding) the second signal section with a bit rate lower than the first bit rate.

Also according to such an encoding method as an embodiment, the same operation and effect as those of the encoding device 2 as the above-described embodiment can also be obtained.

Here, the functions of the decoding device 3 and the encoding device 2 described so far can be implemented as software processing by, for example, a CPU, a DSP, or the like. The software processing is executed based on a program.

A first program as an embodiment is a program causing an information processing device to execute: a function of decoding first encoded data obtained by encoding a first signal section with a first bit rate, the first signal section being a part of a touch signal section which is a signal section indicating a touch state with an object in a tactile signal, the first signal section being a signal section including a boundary between the touch state and a non-touch state with the object; and a function of decoding second encoded data obtained by encoding a second signal section with a bit rate lower than the first bit rate, the second signal section being a signal section except for the first signal section in the touch signal section.

Such a first program can realize the decoding device 3 according to the above-described embodiment.

A second program as an embodiment is a program causing an information processing device to execute: a function of determining a first signal section and a second signal section, the first signal section being a part of a touch signal section which is a signal section indicating a touch state with an object in a tactile signal, the first signal section being a signal section including a boundary between the touch state and a non-touch state with the object, the second signal section being a signal section except for the first signal section in the touch signal section; a function of encoding the first signal section with a first bit rate; and a function of encoding the second signal section with a bit rate lower than the first bit rate. Such a second program can realize the encoding device 2 according to the above-described embodiment.

The first and second programs as described above can be recorded in advance in a recording medium embedded in a device such as a computer device or a ROM or the like in a microcomputer that includes a CPU.

Alternatively, the programs can be stored (recorded) temporarily or perpetually on a removable recording medium such as a flexible disc, a compact disc read-only memory (CD-ROM), a magnet optical (MO) disc, a DVD, a Blu-ray Disc (registered trademark), a magnetic disk, a semiconductor memory, or a memory card. The removable recording medium can be provided as so-called package software.

The first and second programs can be installed from the removable recording medium to a personal computer and can also be downloaded from a download site via a network such as the Internet or a local area network (LAN).

Further, the first and second programs are suitable for a wide range of provision of the decoding device and the encoding device according to the embodiments. For example, the programs are downloaded to a personal computer, a portable information processing device, a mobile phone, a game console, an audio and visual (AV) device, or the like, making it possible for the personal computer or the like to function as the decoding device and the encoding device of the present technology.

11. Present Technology

The present technology can be configured as follows.

(1)

A decoding device, including:

a first decoding unit that decodes first encoded data obtained by encoding a first signal section with a first bit rate, the first signal section being a part of a touch signal section which is a signal section indicating a touch state with an object in a tactile signal, the first signal section being a signal section including a boundary between the touch state and a non-touch state with the object; and a second decoding unit that decodes second encoded data obtained by encoding a second signal section with a bit rate lower than the first bit rate, the second signal section being a signal section except for the first signal section in the touch signal section.

(2)

The decoding device according to (1), including a combining unit that combines first waveform data obtained by decoding the first encoded data and second waveform data obtained by decoding the second encoded data.

(3)

The decoding device according to (2), wherein the combining unit performs cross-fade processing on a combined portion between the first waveform data and the second waveform data.

(4)

A decoding method, including:

decoding first encoded data obtained by encoding a first signal section with a first bit rate, the first signal section being a part of a touch signal section which is a signal section indicating a touch state with an object in a tactile signal, the first signal section being a signal section including a boundary between the touch state and a non-touch state with the object; and decoding second encoded data obtained by encoding a second signal section with a bit rate lower than the first bit rate, the second signal section being a signal section except for the first signal section in the touch signal section.

(5)

A program causing an information processing device to execute:

a function of decoding first encoded data obtained by encoding a first signal section with a first bit rate, the first signal section being a part of a touch signal section which is a signal section indicating a touch state with an object in a tactile signal, the first signal section being a signal section including a boundary between the touch state and a non-touch state with the object; and a function of decoding second encoded data obtained by encoding a second signal section with a bit rate lower than the first bit rate, the second signal section being a signal section except for the first signal section in the touch signal section.

(6)

An encoding device, including:

a determination unit that determines a first signal section and a second signal section, the first signal section being a part of a touch signal section which is a signal section indicating a touch state with an object in a tactile signal, the first signal section being a signal section including a boundary between the touch state and a non-touch state with the object, the second signal section being a signal section except for the first signal section in the touch signal section;

a first encoding unit that encodes the first signal section with a first bit rate; and a second encoding unit that encodes the second signal section with a bit rate lower than the first bit rate.

(7)

The encoding device according to (6), wherein the determination unit determines the first signal section and the second signal section based on section information on the first signal section and the second signal section added to the tactile signal.

(8)

The encoding device according to (6) or (7), wherein the determination unit determines the first signal section and the second signal section based on a result of performing a waveform analysis on the tactile signal.

(9)

The encoding device according to any one of (6) to (8), wherein the determination unit determines the first signal section and the second signal section based on an amplitude change rate of the tactile signal.

(10)

The encoding device according to any one of (6) to (9), wherein the second encoding unit encodes the second signal section by an encoding method using a longer conversion length than in encoding for the first signal section.

(11)

The encoding device according to any one of (6) to (10), wherein the second encoding unit performs parametric encoding on the second signal section.

(12)

The encoding device according to (10) including:

a first buffer memory used for determining the first signal section and the second signal section, and a second buffer memory used for encoding the second signal section according to a result of determining.

(13)

An encoding method, including:

determining a first signal section and a second signal section, the first signal section being a part of a touch signal section which is a signal section indicating a touch state with an object in a tactile signal, the first signal section being a signal section including a boundary between the touch state and a non-touch state with the object, the second signal section being a signal section except for the first signal section in the touch signal section; encoding the first signal section with a first bit rate; and encoding the second signal section with a bit rate lower than the first bit rate.

(14)

A program causing an information processing device to execute:

a function of determining a first signal section and a second signal section, the first signal section being a part of a touch signal section which is a signal section indicating a touch state with an object in a tactile signal, the first signal section being a signal section including a boundary between the touch state and a non-touch state with the object, the second signal section being a signal section except for the first signal section in the touch signal section;

a function of encoding the first signal section with a first bit rate; and a function of encoding the second signal section with a bit rate lower than the first bit rate.

Finally, the advantageous effects described in the present disclosure are exemplary and not limited, and may have other advantageous effects or may have part of the advantageous effects described in the present disclosure. The embodiments described in the present disclosure are merely examples, and the present technology is not limited to the above-described embodiments. Therefore, it goes without saying that various changes aside from the above-described embodiments can be made according to the design and the like within a scope that does not depart from the technical spirit of the present technology. It should be noted that not all combinations of configurations described in the embodiments are essential for solving the problem.

REFERENCE SIGNS LIST

1 Tactile reproduction system
2 Encoding device
3 Decoding device
24 Encoding unit
33 Combining unit
34 Decoding unit
**34*a*** First decoding unit
**34*b*** Second decoding unit
82 Determination unit
83 First encoding unit
84 Second encoding unit
86 First buffering unit
87 Second buffering unit
200 Touch signal section

The invention claimed is:

1. A decoding device, comprising:

circuitry configured to:

decode first encoded data obtained by encoding a first signal section with a first encoding method, the first signal section being a signal section including a boundary between a touch state and a non-touch state with an object; and decode second encoded data obtained by encoding a second signal section with a second encoding method, the second signal section being a signal section except for the first signal section.

2. The decoding device according to claim 1, wherein the first signal section is a part of a touch signal section which is a signal section indicating a touch state with the object in a tactile signal.

3. The decoding device according to claim 1, wherein the first encoding method is an encoding method with a first bit rate, and the second encoding method is an encoding method with a second bit rate lower than the first bit rate.

4. The decoding device according to claim 1, wherein the circuitry is further configured to combine first waveform data obtained by decoding the first encoded data and second waveform data obtained by decoding the second encoded data.

5. The decoding device according to claim 4, wherein the circuitry is further configured to perform cross fade processing on a combined portion between the first waveform data and the second waveform data.

6. A decoding method, comprising:

decoding first encoded data obtained by encoding a first signal section with a first encoding method, the first signal section being a signal section including a boundary between a touch state and a non-touch state with an object; and decoding second encoded data obtained by encoding a second signal section with a second encoding method, the second signal section being a signal section except for the first signal section.

7. A non-transitory computer-readable medium having embodied thereon a program, which when executed by at least one processor of an information processing device causes the information processing device to execute a method, the method comprising:

decoding first encoded data obtained by encoding a first signal section with a first encoding method, the first signal section being a signal section including a boundary between a touch state and a non-touch state with an object; and decoding second encoded data obtained by encoding a second signal section with a second encoding method, the second signal section being a signal section except for the first signal section.

8. An encoding device, comprising:

circuitry configured to:

determine a first signal section and a second signal section, the first signal section being a signal section including a boundary between a touch state and a non-touch state with an object, the second signal section being a signal section except for the first signal section;

encode the first signal section with a first encoding method; and encode the second signal section with a second encoding method.

9. The encoding device according to claim 8, wherein the circuitry is further configured to determine the first signal section and the second signal section based on section information on the first signal section and the second signal section added to a tactile signal.

10. The encoding device according to claim 8, wherein the circuitry is further configured to determine the first signal section and the second signal section based on a result of performing a waveform analysis on a tactile signal.

11. The encoding device according to claim 8, wherein the circuitry is further configured to determine the first signal section and the second signal section based on an amplitude change rate of the tactile signal.

12. The encoding device according to claim 8, wherein the circuitry is further configured to encode the second signal section by an encoding method using a longer conversion length than in encoding for the first signal section.

13. The encoding device according to claim 8, wherein the circuitry is further configured to perform parametric encoding on the second signal section.

14. The encoding device according to claim 12, further comprising:

a first buffer memory used for determining the first signal section and the second signal section, and a second buffer memory used for encoding the second signal section according to a result of the determining.

15. An encoding method, comprising:
- determining a first signal section and a second signal section, the first signal section being a signal section including a boundary between a touch state and a non-touch state with an object, the second signal section being a signal section except for the first signal section;
- encoding the first signal section with a first encoding method; and
- encoding the second signal section with a second encoding method.

16. A non-transitory computer-readable medium having embodied thereon a program, which when executed by at least one processor of an information processing device causes the information processing device to execute a method, the method comprising:
- determining a first signal section and a second signal section, the first signal section being a signal section including a boundary between a touch state and a non-touch state with an object, the second signal section being a signal section except for the first signal section;
- encoding the first signal section with a first encoding method; and
- encoding the second signal section with a second encoding method.

* * * * *